US007315107B2

(12) United States Patent
Kando et al.

(10) Patent No.: US 7,315,107 B2
(45) Date of Patent: Jan. 1, 2008

(54) SURFACE ACOUSTIC WAVE DEVICE

(75) Inventors: Hajime Kando, Otokuni-gun (JP); Daisuke Yamamoto, Takatsuki (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/623,506

(22) Filed: Jan. 16, 2007

(65) Prior Publication Data

US 2007/0108868 A1    May 17, 2007

Related U.S. Application Data

(62) Division of application No. 10/638,327, filed on Aug. 12, 2003, now Pat. No. 7,180,222.

(30) Foreign Application Priority Data

Aug. 12, 2002  (JP)  ............................. 2002-234886
Jul. 7, 2003   (JP)  ............................. 2003-193134

(51) Int. Cl.
    H03H 9/145      (2006.01)
(52) U.S. Cl. ...................... 310/313 R; 310/313 B; 310/360; 310/361
(58) Field of Classification Search ................ 310/313, 310/360–361
    See application file for complete search history.

(56) References Cited

U.S. PATENT DOCUMENTS

| 5,773,911 | A  | 6/1998  | Tanaka et al.  |
| 5,923,231 | A  | 7/1999  | Ohkubo et al.  |
| 6,070,310 | A  | 6/2000  | Ito et al.     |
| 6,317,014 | B1 | 11/2001 | Kadota         |
| 6,356,167 | B1 | 3/2002  | Kadota et al.  |
| 6,600,391 | B2 | 7/2003  | Kadota et al.  |
| 6,661,313 | B2 | 12/2003 | Naumenko et al.|
| 6,833,774 | B2 | 12/2004 | Abbott et al.  |
| 6,865,786 | B2 | 3/2005  | Nakao et al.   |
| 6,914,498 | B2 | 7/2005  | Kadota         |
| 2002/0079989 | A1 | 6/2002 | Kadota et al. |

FOREIGN PATENT DOCUMENTS

JP    08-288788    11/1996

JP    10-84245 A    3/1998

OTHER PUBLICATIONS

"LiTaO3"; Acoustical Science and Technology, The Acoustical Society of Japan; vol. 36, No. 3, 1980, pp. 140-145.
Hashimoto et al.; "On Radiation condition in leaky SAW analysis"; IEICE Technical Report; US95-46; Sep. 1995, pp. 25-30.
Sato et al.; "Longitudinal Leaky Surface Acoustic Wave On Li2B407;" Proceedings of the 1994 IEICE General Conference, A443, 1994.
Tonami et al.; "Characteristics of the Second Leaky Surface Acoustic Waves with Low Propagation Loss on LiNbO3 Substrate;" Proceedings of the 1996 IEICE General Conference, A305, 1996.
Yamanouchi et al.; "SiO2/LiTaO3, LiNbO3 Structure Acoustic Surface Wave Materials Fabricated by Plasma CVD Method;" IEICE Ultrasonic Group Technical Report US80-3, 1980.
"Acoustic Wave Device Technical Handbook;" Japan Society for the Promotion of Science, 150th Committee on Acoustic Wave Technology; Nov. 30, 1991; p. 549; vol. 1.
Campbell et al.; "A Method for Estimating Optimal Crystal Cuts and Propagation Directions for Excitation of Piezoelectric Surface Waves;" IEEE Trans. Sonics and Ultrason.; 1968; pp. 209-217; vol. SU-15.
Kadota et al., "High Frequency Edge Reflection Resenators Using Shear Horizontal Wave and Longitudinal Leaky SAW Wave"; 31st EM Symposium; IEEE UFFC-S Japan Chapter; May 15-16; pp. 101-106, (2002).
Tonami et al.; "Characteristics of Leaky Surface Acoustic Waves Propagating on LiNbO3 and LiTaO3 Substrates"; Jpn. J. Appl. Phys.; vol. 34 (1995); pp. 2664-2667.
Official communication issued in the counterpart Japanese Application No. 2003-193134, mailed on Aug. 14, 2007.

*Primary Examiner*—J. San Martin
(74) *Attorney, Agent, or Firm*—Keating & Bennett, LLP

(57) ABSTRACT

A surface acoustic wave device includes a $LiNbO_3$ substrate with a Euler angle in an area defined by a rectangle having four corners with coordinates (1) (0°, 7°, 101°), (2) (0°, 23°, 79°), (3) (0°, 23°, 79°), and (4) (0°, 7°, 79°), for example, and an electrode film made of Au, wherein surface acoustic waves including a longitudinal wave component as a main component are propagated thereon. The surface acoustic wave device uses longitudinal surface acoustic waves having a phase speed greater than with the "slow transverse wave", and has a great electromechanical coupling coefficient and small propagation loss, and is suitable for handling high-frequency signals.

12 Claims, 35 Drawing Sheets

EULER ANGLE (0, 16, ψ)

SURFACE ACOUSTIC WAVE DEVICE

This application is a Divisional Application of U.S. patent application Ser. No. 10/638,327 filed Aug. 12, 2003, now U.S. Pat. No. 7,180,222.

BACKGROUND OF THE INVENTION

1. Field of the Invention

The present invention relates to a surface acoustic wave device used for a resonator, band filter, or other suitable device, and more particularly, to a surface acoustic wave device wherein an electrode film of Au is formed on a $LiNbO_3$ substrate, using second leaky surface acoustic waves.

2. Description of the Related Art

Surface acoustic wave devices are widely used in band filters for portable mobile communication devices, due to the high performance, light weight, and small size, thereof.

With surface acoustic wave filters, the operation frequency F is determined by the ratio of the phase speed V of the surface acoustic wave relative to the finger period L of the interdigital transducer (IDT). That is to say, the operation frequency F is represented by the relation F=V/L.

In recent years, demand for surface acoustic wave filters with high operation frequencies is increasing, and accordingly, development of surface acoustic wave filters using surface acoustic waves with high phase speed V is being undertaken.

The band width of the surface acoustic wave filters is dependent upon the electromechanical coupling coefficient $k_s^2$ of the surface acoustic wave. That is to say, in the event that the electromechanical coupling coefficient is great, a surface acoustic wave filter with a wide band width is obtained, and on the other hand, in the event that the electromechanical coupling coefficient is small, a surface acoustic wave filter with a narrow band width is obtained. Accordingly, there is the need to determine the electromechanical coupling coefficient $k_s^2$ according to the usage.

On the other hand, loss occurring in propagation of the surface acoustic wave, i.e., the propagation loss, causes deterioration of the insertion loss of the surface acoustic wave device, or causes deterioration of the impedance ratio which is the ratio of the resonance resistance of the surface acoustic wave resonator or the impedance at the antiresonant frequency point thereof, as to the impedance at the resonant frequency point thereof. Accordingly, a small propagation loss is preferable.

Furthermore, the change in the operation frequency dependent upon the temperature is preferably small with regard to the surface acoustic wave device. In the event that the change is great, the practically-available pass band width and stop band width are reduced, leading to abnormal oscillation in the event of a surface acoustic wave resonator making up an oscillation circuit. Accordingly, a surface acoustic wave filter wherein the change in operation frequency per 1° C. (TFC) is as small as possible is desired.

As a surface acoustic wave used for the surface acoustic wave devices, the Rayleigh wave and leaky surface acoustic wave are known. In many cases, the leaky surface acoustic wave propagates at a phase speed higher than with the Rayleigh wave. Accordingly, with the surface acoustic wave devices used for the high-frequency band, in many cases, a leaky surface acoustic wave propagating on the substrate such as any of 36°-Y-cut-X-transmission $LiTaO_3$ substrate through 42°-Y-cut-X-transmission $LiTaO_3$ substrate, 41°-Y-cut-X-transmission $LiNbO_3$ substrate, or 64°-Y-cut-X-transmission $LiNbO_3$ substrate is used, wherein the principal component is the transverse wave component (u2 component) horizontal to the surface acoustic wave propagation direction. The aforementioned leaky surface acoustic wave propagates at a phase speed between 4000 m/s and 4500 m/s.

In recent years, the second leaky surface acoustic wave with the phase speed between 5000 m/s to 7000 m/s, higher than with the conventionally-used leaky surface acoustic waves, attracts attention, wherein the principal component is the longitudinal wave component (u1 component). The surface acoustic wave devices using the aforementioned second leaky surface acoustic wave are disclosed in the non-patent documents 1 through 3, and the patent document 1 described below.

A surface acoustic wave device using leaky surface acoustic wave with the phase speed of 6656 m/s on a lithium tetra-borate substrate, generally formed of a longitudinal wave component (u1 component), is disclosed in the non-patent document 1, "Longitudinal Leaky Surface Acoustic Wave On $Li_2B_4O_7$" (Proceedings of the 1994 Spring IEICE General Conference, A443, 1994).

Furthermore, a surface acoustic wave device using the second leaky surface acoustic wave, generally formed of the longitudinal wave component, which propagates on a $LiTaO_3$ substrate or a $LiNbO_3$ substrate, is disclosed in the non-patent document 2, "Characteristics of Leaky Surface Acoustic Waves Propagating On $LiNbO_3$ And $LiTaO_3$ Substrates" (S. Tonami, A. Nishikata, Y. Shimizu, Jpn. J. Appl. Phys. Vol. 34 (1995) pp. 2664-2667). The second document describes that the surface acoustic wave device using a $LiNbO_3$ substrate exhibits the maximum electromechanical coupling coefficient $k^2$ of 12.9%, the propagation loss in the electrically open-circuit state (free surface), and in the electrically short-circuit state (short-circuit surface), of approximately 0.06 dB/λ and 3.9 dB/λ, respectively, with the Euler angles of (90°, 90°, 36°), wherein the propagation loss on the short-circuit surface is greater than as compared with the free surface. Furthermore, the second document describes that the surface acoustic wave device exhibits the frequency-temperature property TFC on the free surface and the short-circuit surface of approximately 67 ppm and 78 ppm, respectively, with the Euler angles of (90°, 90°, 36°).

Furthermore, a surface acoustic wave device is described in the non-patent document 3, "Characteristics of the Second Leaky Surface Acoustic Waves with Low Propagation Loss on $LiNbO_3$" (Tonami, Nishikata, Shimizu, Proceedings of the 1996 IEICE General Conference, A305, 1996), wherein the second leaky surface acoustic wave propagates with markedly small propagation loss of 0.00362 on a $LiNbO_3$ substrate with the Euler angles of (82°, 92°, 37°). Now, making a comparison between the propagation loss with the Euler angles of (90°, 90°, 37°) described in Table 1 in the non-patent document 3 and the propagation loss indicated in FIG. 6 in the aforementioned non-patent document 2, the aforementioned propagation loss is considered to be caused on the free surface.

Furthermore, the patent document 1 (Japanese Unexamined Patent Application Publication No. 8-288788) describes that in the event that the longitudinal-wave pseudo-surface acoustic wave is adjusted so as to propagate with a phase speed less than the "fast transverse wave" and the "slow transverse wave", the longitudinal surface acoustic wave propagates with the propagation loss of zero, and in the event that the surface acoustic wave device is formed of a $LiNbO_3$ substrate with an electroconductive film made of Au with the thickness of KH of 0.3 (H/λ=4.8%) or more, the longitudinal surface acoustic wave propagates with the propagation loss of zero, as well.

On the other hand, a non-patent document 4, "SiO$_2$LiTaO$_3$, LiNbO$_3$ Structure Acoustic Wave Materials Fabricated by Plasma CVD Method" (Nakajyou, Yamanouchi, Shibayama, IEICE Ultrasonic Group Technical Report US80-3, 1980), describes a surface acoustic wave device with a SiO$_2$ film formed thereon exhibits improved TCF with regard to the leaky surface acoustic wave.

The surface acoustic wave device using the longitudinal leaky wave propagating on a lithium tetra-borate substrate described in the non-patent document 1 exhibits a small electromechanical coupling coefficient of 2.7%. Accordingly, a surface acoustic wave filter having such a configuration is formed with a narrow band width, and accordingly, cannot exhibit sufficient properties required for RF filters used for cellular phones or other devices.

With the surface acoustic wave device using the second leaky surface acoustic wave propagating on a LiTaO$_3$ substrate or a LiNbO$_3$ substrate described in the non-patent documents 2 and 3, a suitable electromechanical coupling coefficient can be obtained, and also the propagation loss is small on the free surface. However, the surface acoustic wave device has the disadvantage of great propagation loss in the event that the substrate surface is electrically short-circuited by forming a metal film thereon. The propagation loss of the IDT is similar to that in a case of the short-circuit surface, and accordingly, a surface acoustic wave device with a small propagation loss on a short-circuit surface or a metallized surface is expected. However, the surface acoustic wave device using the second leaky surface acoustic wave described in the non-patent document 2 or 3 cannot exhibit required properties.

On the other hand, with the configuration disclosed in the patent document 1, although the surface acoustic wave device exhibits the propagation loss of zero, the surface acoustic wave propagates generally at the same phase speed as the Rayleigh wave, which is only around 3000 m/s. Accordingly, the surface acoustic wave device has difficulty in handling high-frequency signals. In addition, the surface acoustic wave device exhibits TFC of only around 79 ppm. Accordingly, in the event that the surface acoustic wave device is used at a temperature between around −20 and +80° C., a great change in frequency of 7,000 ppm is caused. Accordingly, the surface acoustic wave device has difficulty in exhibiting acute filter properties all over the operating temperature range.

Note that while the above-described non-patent document 4 describes a method for improving the temperature property TFC of the surface acoustic wave device using the leaky surface acoustic wave by forming a SiO$_2$ film thereon, conventionally, no configuration for improving the temperature properties of the substrate using the aforementioned second leaky acoustic wave has been known.

SUMMARY OF THE INVENTION

In order to overcome the problems described above, preferred embodiments of the present invention provide a surface acoustic wave device using the second leaky acoustic wave and having a great electromechanical coupling coefficient, small propagation loss, a phase speed greater than with the "slow transverse wave", and a small temperature property TCF.

According to a first preferred embodiment of the present invention, a surface acoustic wave device includes a LiNbO$_3$ substrate and an electrode film formed of Au or an alloy of Au as a principal component on the LiNbO$_3$ substrate, wherein surface acoustic waves including a longitudinal wave component as a main component propagate, and wherein the Euler angle of the LiNbO$_3$ substrate is a Euler angle contained within the areas A01 through A17 formed of a rectangle with four corners defined by the coordinates (1), (2), (3), and (4) shown in Table 1 below, or a Euler angle equivalent thereof.

TABLE 1

| AREA | COORDINATES (1) | COORDINATES (2) | COORDINATES (3) | COORDINATES (4) |
| --- | --- | --- | --- | --- |
| AREA A01 | (0°, 7°, 101°) | (0°, 23°, 101°) | (0°, 23°, 79°) | (0°, 7°, 79°) |
| AREA A02 | (0°, 75°, 101°) | (0°, 92°, 101°) | (0°, 92°, 79°) | (0°, 75°, 79°) |
| AREA A03 | (0°, 146°, 155°) | (0°, 168°, 155°) | (0°, 168°, 120°) | (0°, 146°, 120°) |
| AREA A04 | (0°, 146°, 60°) | (0°, 168°, 60°) | (0°, 168°, 25°) | (0°, 146°, 25°) |
| AREA A05 | (10°, 6°, 94°) | (10°, 12°, 94°) | (10°, 23°, 67°) | (10°, 6°, 67°) |
| AREA A06 | (10°, 77°, 96°) | (10°, 93°, 96°) | (10°, 93°, 72°) | (10°, 77°, 72°) |
| AREA A07 | (10°, 139°, 162°) | (10°, 164°, 162°) | (10°, 164°, 107°) | (10°, 139°, 107°) |
| AREA A08 | (10°, 150°, 62°) | (10°, 171°, 62°) | (10°, 171°, 33°) | (10°, 150°, 33°) |
| AREA A09 | (20°, 7°, 84°) | (20°, 24°, 84°) | (20°, 24°, 61°) | (20°, 7°, 61°) |
| AREA A10 | (20°, 78°, 93°) | (20°, 95°, 93°) | (20°, 95°, 46°) | (20°, 78°, 46°) |
| AREA A11 | (20°, 127°, 167°) | (20°, 163°, 167°) | (20°, 163°, 118°) | (20°, 127°, 118°) |
| AREA A12 | (20°, 153°, 67°) | (20°, 172°, 67°) | (20°, 172°, 40°) | (20°, 153°, 40°) |
| AREA A13 | (30°, 10°, 76°) | (30°, 25°, 76°) | (30°, 25°, 51°) | (30°, 10°, 51°) |
| AREA A14 | (30°, 41°, 156°) | (30°, 58°, 156°) | (30°, 58°, 133°) | (30°, 41°, 133°) |
| AREA A15 | (30°, 80°, 93°) | (30°, 100°, 93°) | (30°, 100°, 24°) | (30°, 80°, 24°) |
| AREA A16 | (30°, 139°, 156°) | (30°, 122°, 156°) | (30°, 122°, 133°) | (30°, 139°, 133°) |
| AREA A17 | (30°, 170°, 76°) | (30°, 155°, 76°) | (30°, 155°, 51°) | (30°, 170°, 51°) |

With the surface acoustic wave device according to the first preferred embodiment of the present invention, a LiNbO$_3$ substrate with the Euler angle in the above-described specific range is preferably used, thereby providing a surface acoustic device using the second leaky surface acoustic wave with small propagation loss, great electromechanical coupling coefficient, and high phase speed.

According to a second preferred embodiment of the present invention, a surface acoustic wave device includes a LiNbO$_3$ substrate and an electrode film formed of Au or an alloy of Au as a principal component on the LiNbO$_3$ substrate, wherein surface acoustic waves including a longitudinal wave component as a main component propagate, and wherein the Euler angle of the LiNbO$_3$; substrate is ($\phi$, θ, ψ) (φ is in the range between about −13° and about 13°, θ is in the range between about 7° and about 23°, and ψ is in the range between about 79° and about 101°), or a Euler angle equivalent thereof, and wherein H/λ (H is the thickness of the electrode film, and λ is the wavelength of the surface acoustic wave) is in the range between about 0.005 and about 0.06.

With the surface acoustic wave device according to the second preferred embodiment of the present invention, a LiNbO₃ substrate with the Euler angle in the above-described specific range is preferably used, and furthermore, an electrode film with the thickness in the above-described specific range is preferably used, thereby providing a surface acoustic device utilizing the second leaky surface acoustic wave with high phase speed, and small propagation loss αm.

According to a third preferred embodiment of the present invention, a surface acoustic wave device includes a LiNbO₃ substrate and an electrode film formed of Au or an alloy of Au as a principal component on the LiNbO₃ substrate, wherein surface acoustic waves including a longitudinal wave component as a main component propagate, and wherein the Euler angle of the LiNbO₃ substrate is (φ, θ, ψ) (φ is in the range between about −6° and about 6°, θ is in the range between about 14° and about 34°, and ψ is in the range between about 84° and about 96°), or a Euler angle equivalent thereof, and wherein H/λ (H is the thickness of the electrode film, and λ is the wavelength of the surface acoustic wave) is in the range between about 0.005 and about 0.06.

With the surface acoustic wave device according to the third preferred embodiment of the present invention, a LiNbO₃ substrate with the Euler angle in the above-described specific range is preferably used, and furthermore, an electrode film with the thickness in the above-described specific range is preferably used, thereby providing a surface acoustic device utilizing the second leaky surface acoustic wave with high phase speed, and small propagation loss αf.

According to a fourth preferred embodiment of the present invention, a surface acoustic wave device includes a LiNbO₃ substrate and an electrode film formed of Au or an alloy of Au as a principal component on the LiNbO₃ substrate, wherein surface acoustic waves including a longitudinal wave component as a main component propagate, and wherein the Euler angle of the LiNbO₃ substrate is (φ, θ, ψ) (φ is in the range between about −6° and about 6°, θ is in the range between about 14° and about 23°, and ψ is in the range between about 84° and about 96°), or a Euler angle equivalent thereof, and wherein H/λ (H is the thickness of the electrode film, and λ is the wavelength of the surface acoustic wave) is in the range between about 0.005 and about 0.06.

With the surface acoustic wave device according to the fourth preferred embodiment of the present invention, a LiNbO₃ substrate with the Euler angle in the above-described specific range is preferably used, and furthermore, an electrode film with the thickness in the above-described specific range is preferably used, thereby providing a surface acoustic device utilizing the second leaky surface acoustic wave with high phase speed, and with small propagation loss αm and αf on the short-circuit surface and on the open-circuit surface.

According to a fifth preferred embodiment of the present invention, a surface acoustic wave device includes a LiNbO₃ substrate and an electrode film formed of Au or an alloy of Au as a principal component on the LiNbO₃ substrate, wherein surface acoustic waves including a longitudinal wave component as a main component propagate, and wherein the Euler angle of the LiNbO₃ substrate is (φ, θ, ψ) (φ is in the range between about 21.5° and about 38.5°, θ is in the range between about 80° and about 100°, and ψ is in the range between about 24.5° and about 91.8°), or a Euler angle equivalent thereto, and wherein H/λ (H is the thickness of the electrode film, and λ is the wavelength of the surface acoustic wave) is in the range between about 0.005 and about 0.08.

With the surface acoustic wave device according to the fifth preferred embodiment of the present invention, a LiNbO₃ substrate with the Euler angle in the above-described specific range is preferably used, and furthermore, an electrode film with the thickness in the above-described specific range is preferably used, thereby providing a surface acoustic device utilizing the second leaky surface acoustic wave with a great electromechanical coupling coefficient, high phase speed, and small propagation loss αm.

According to a sixth preferred embodiment of the present invention, a surface acoustic wave device includes a LiNbO₃ substrate and an electrode film formed of Au or an alloy of Au as a principal component on the LiNbO₃ substrate, wherein surface acoustic waves including a longitudinal wave component as a main component propagate, and wherein the Euler angle of the LiNbO₃ substrate is (φ, θ, ψ) (φ is in the range between about 21.5° and about 38.5°, θ is in the range between about 80° and about 100°, and ψ is in the range between about 1° and about 96.5°), or a Euler angle equivalent thereto, and wherein H/λ (H is the thickness of the electrode film, and λ is the wavelength of the surface acoustic wave) is in the range between about 0.005 and about 0.08.

With the surface acoustic wave device according to the sixth preferred embodiment of the present invention, a LiNbO₃ substrate with the Euler angle in the above-described specific range is preferably used, and furthermore, an electrode film with the thickness in the above-described specific range is preferably used, thereby providing a surface acoustic device utilizing the second leaky surface acoustic wave with a great electromechanical coupling coefficient, high phase speed, and small propagation loss αm.

According to a seventh preferred embodiment of the present invention, a surface acoustic wave device includes a LiNbO₃ substrate and an electrode film formed of Au or an alloy of Au as a principal component on the LiNbO₃ substrate, wherein surface acoustic waves including a longitudinal wave component as a main component propagate, and wherein the Euler angle of the LiNbO₃ substrate is (φ, θ, ψ) (φ is in the range between about −42° and about 42°, θ is in the range between about 74.8° and about 94.2°, and ψ is in the range between about 77° and about 103°), or a Euler angle equivalent thereto, and wherein H/λ (H is the thickness of the electrode film, and λ is the wavelength of the surface acoustic wave) is in the range between about 0.005 and about 0.077.

With the surface acoustic wave device according to the seventh preferred embodiment of the present invention, a LiNbO₃ substrate with the Euler angle in the above-described specific range is preferably used, and furthermore, an electrode film with the thickness in the above-described specific range is preferably used, thereby providing a surface acoustic device utilizing the second leaky surface acoustic wave with a great electromechanical coupling coefficient, high phase speed, and small propagation loss αm.

According to an eighth preferred embodiment of the present invention, a surface acoustic wave device includes a LiNbO₃ substrate and an electrode film formed of Au or an alloy of Au as a principal component on the LiNbO₃ substrate, wherein surface acoustic waves including a longitudinal wave component as a main component propagate, and wherein H/λ (H is the thickness of the electrode film, and λ is the wavelength of the surface acoustic wave) is in the range between about 0.0125 and about 0.0267.

With the surface acoustic wave device according to the eighth preferred embodiment of the present invention, an electrode film with the thickness H in the above-described specific range is preferably used, thereby providing a surface acoustic device utilizing the second leaky surface acoustic wave with high impedance ratio at the resonant point and the antiresonant point, and high phase speed.

According to a ninth preferred embodiment of the present invention, a surface acoustic wave device includes a LiNbO$_3$ substrate and an electrode film formed of Au or an alloy of Au as a principal component on the LiNbO$_3$ substrate, wherein surface acoustic waves including a longitudinal wave component as a main component propagate, and wherein the Euler angle of the LiNbO$_3$ substrate is (φ, θ, ψ) (φ is in the range between about 85° and about 95°, θ is in the range between about 85° and about 95°, and ψ is in the range between about 30° and about 130°), or a Euler angle equivalent thereto.

With the surface acoustic wave device according to the ninth preferred of the present invention, a LiNbO$_3$ substrate with the Euler angle in the above-described specific range is preferably used, thereby providing a surface acoustic device utilizing the second leaky surface acoustic wave with high impedance ratio at the resonant point and the antiresonant point, and high phase speed.

A bus bar, IDT, reflector, or surface acoustic waveguide may be formed of the electrode film. Also, a SiO$_2$ film may be formed so as to cover the electrode film, thereby reducing the temperature property TCF of the surface acoustic wave device.

With the above-described configuration, a SiO$_2$ film is formed with a film thickness in the above-described specific range, thereby providing a surface acoustic wave device utilizing the second leaky surface acoustic wave with reduced temperature property TCF.

Other features, elements, characteristics and advantages of the present invention will become more apparent from the following detailed description of preferred embodiments with reference to the attached drawings.

DETAILED DESCRIPTION OF PREFERRED EMBODIMENTS

Figure 1:
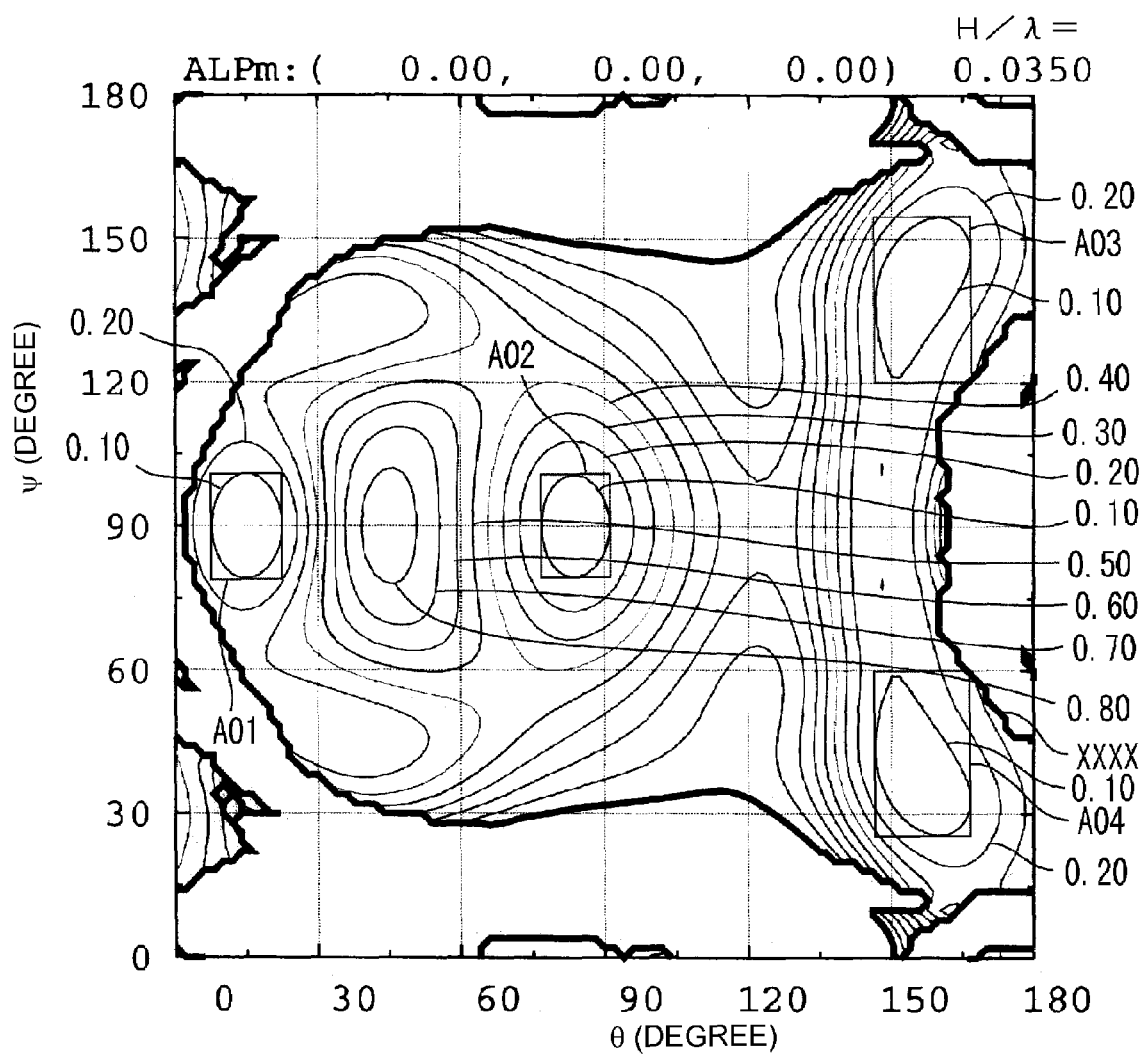
FIG. 1 shows the relationship between the propagation loss αm of a u1-component-dominant surface acoustic wave propagating on the short-circuit surface and the Euler angles, with regard to a configuration wherein an Au electrode film is provided on a LiNbO$_3$ substrate with the Euler angles of (0°, θ, ψ) and a film thickness H/λ of about 0.035.
Figure 2:
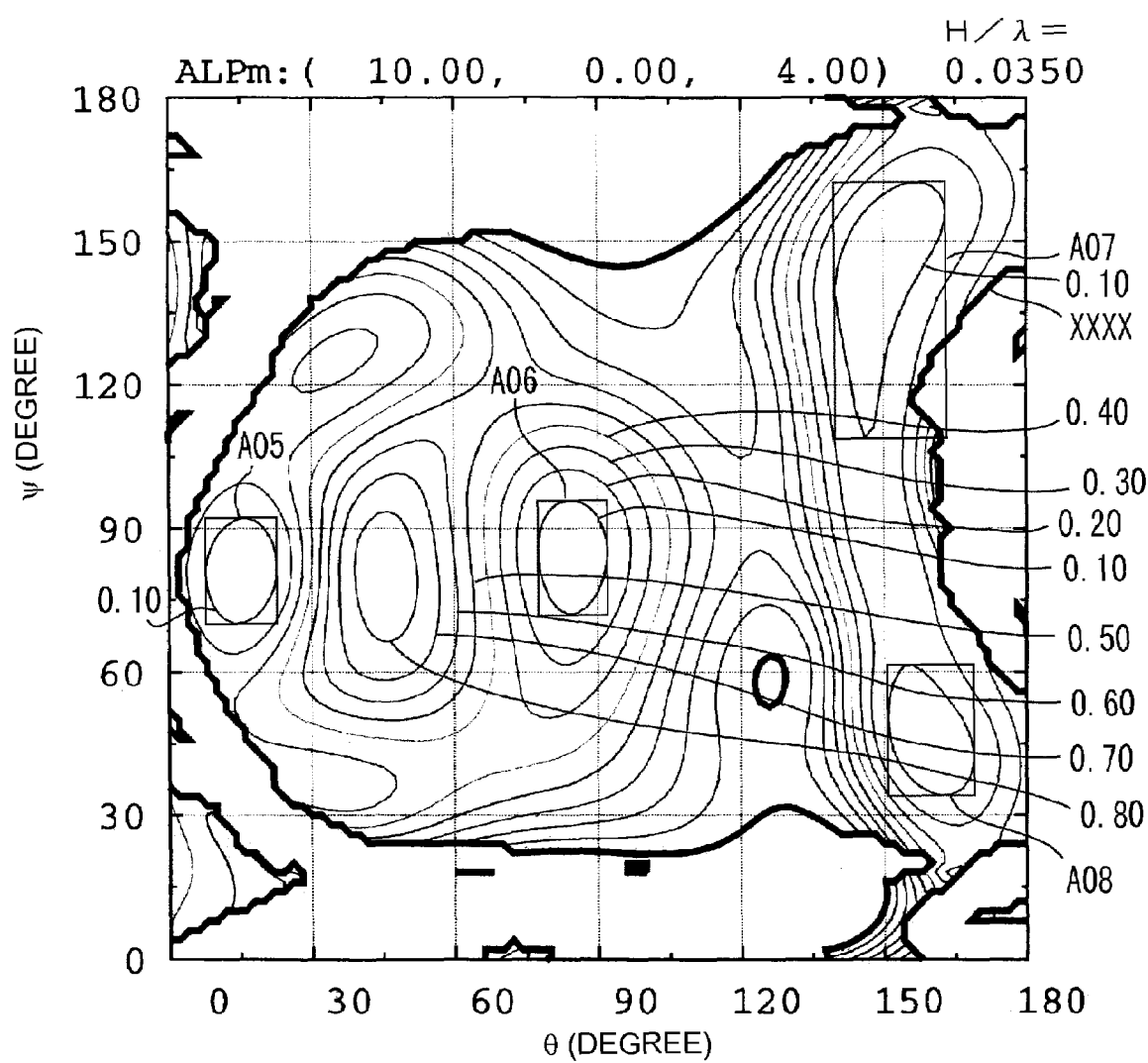
FIG. 2 shows the relationship between the propagation loss αm of the u1-component-dominant surface acoustic wave propagating on the short-circuit surface and the Euler angles, with regard to a configuration wherein an Au electrode film is provided on a LiNbO$_3$ substrate with the Euler angles of (10°, θ, ψ) and a film thickness H/λ of about 0.035.

The present invention will now be described more fully by way of specific preferred embodiments, with reference to the drawings.

Definitions of the Terms

Description will be made below regarding the definitions of the terms in the present specification. "Surface acoustic wave" is the general term to include the aforementioned second leaky surface acoustic wave, and the longitudinal surface acoustic wave described in the non-patent document 4 and the like. The second leaky surface acoustic wave is also referred to as "longitudinal leaky surface acoustic wave", "longitudinal pseudo-surface surface acoustic wave", or "longitudinal leaky wave". In a case in which the second leaky surface acoustic wave has no leaky components, the second leaky surface acoustic wave is referred to as "longitudinal surface acoustic wave".

Next, description will be made regarding the Euler angles. With the Euler angles for representing the cut surface of the substrate and the propagation direction of the surface acoustic wave, the right-handed-scale Euler angle described in "acoustic wave device technical handbook" (Japan Society for the Promotion of Science, 150th Committee on Acoustic Wave Technology, vol. 1, No. 1, p. 549 (30 Nov., 1991)) is used in the present specification.

Next, description will be made regarding the crystal axes. With the crystal axes of LiNbO₃ for the initial value of Euler angle, let us say the Z-axis is parallel to the c-axis, the X-axis parallel to the arbitrary one of the equivalent a-axes in three directions, and the Y-axis is perpendicular to the plane including the X-axis and the Y-axis.

In the present specification, the displacement components are represented by "u1", "u2", and "u3". The "u1" represents the displacement in the X-axis direction, u2 represents the displacement in the Y-axis direction, and u3 represents the displacement in the Z-axis direction. The above-described second leaky surface acoustic wave is referred to as "u1-component-dominant longitudinal leaky surface acoustic wave".

Next, description will be made regarding the equivalent Euler angle. In the present specification, the equivalent Euler angle indicates the Euler angle ($\phi$, $\theta$, $\psi$) of the LiNbO₃ substrate equivalent from the crystallographic point. LiNbO₃ is a crystal which belongs to the trigonal system 3 m point group as described in "Acoustical Science and Technology, The Acoustical Society of Japan" Vol. 36, No. 3, pp. 140-145 (1980), and accordingly, the relationship described below holds.

$$F(\phi, \theta, \psi) = F(60°-\phi, -\theta, \psi) = F(60°+\phi, -\theta, 180°-\psi) = F(\phi, 180°+\theta, 180°-\psi) = F(\phi, \theta, 180°+\psi) \quad (1)$$

Note that F represents arbitrary surface acoustic wave properties that are dependent upon the Euler angle such as the electromechanical coupling coefficient, the propagation loss, the temperature properties TCF, the power flow angle PFA, or the natural unidirectionality. Note that with the PFA or the natural unidirectionality, in the event of the reverse propagation direction, although sign inversion is caused, the absolute value is kept the same. Accordingly, the propagation properties of the surface acoustic wave with the Euler angle of (30°, $\theta$, $\psi$) are equivalent to the propagation properties of the surface acoustic wave with the Euler angle of (90°, 180°−$\theta$, 180°−$\psi$). Furthermore, the propagation properties of the surface acoustic wave with the Euler angle of (30°, 90°, 45°) are equivalent to the propagation properties of the surface acoustic wave with the Euler angles shown in Table 2 below.

TABLE 2

| Φ [°] | θ [°] | Ψ [°] |
|---|---|---|
| 30 | 90 | 225 |
| 30 | 270 | 135 |
| 30 | 270 | 315 |
| 90 | 90 | 135 |
| 90 | 90 | 315 |
| 90 | 270 | 45 |
| 90 | 270 | 225 |
| 150 | 90 | 45 |
| 150 | 90 | 225 |
| 150 | 270 | 135 |
| 150 | 270 | 315 |
| 210 | 90 | 135 |
| 210 | 90 | 315 |
| 210 | 270 | 45 |
| 210 | 270 | 225 |
| 270 | 90 | 45 |
| 270 | 90 | 225 |
| 270 | 270 | 135 |
| 270 | 270 | 315 |
| 330 | 90 | 135 |
| 330 | 90 | 315 |
| 330 | 270 | 45 |
| 330 | 270 | 225 |

Note that while the material properties of polycrystalline Au are used for calculation for the present invention, the crystal orientation dependence upon the substrate is dominant for the properties of the surface acoustic wave due to the crystal orientation dependence upon the film itself, and accordingly, even in a case of using a crystalline film such as an epitaxial film or other suitable film, the propagation properties of the surface acoustic wave, as accurate as is practically permissible, can be obtained from Expression (1).

Description will be made regarding the propagation properties of the surface acoustic wave on the short-circuit surface and the open-circuit surface in the preferred embodiments described below, obtained using the method for analyzing the propagation properties of the surface acoustic wave described in "A Method For Estimating Optimal Cuts And Propagation Directions For Excitation And Propagation Directions For Excitation Of Piezoelectric Surface Waves" (J. J. Cambell and W. R. Jones, IEEE Trans. Sonics and Ultrason., Vol. SU-15 (1968) pp. 209-217), "Analysis Of Pseudo-surface Surface Acoustic Waves Using Radiation Condition" (Hashimoto, Endou, Yamaguchi, IEICE Technical Report, US95-46, 1995-09, pp. 25-30), or the like. Note that with an electric-conductivity of Au of 0, and with the relative dielectric constant thereof as 1, the propagation properties on the open-circuit surface were obtained.

First Preferred Embodiment

FIGS. 1 through 4 indicates the propagation loss of the u1-component-dominant surface acoustic waves on the short-circuit surface which propagate on the configurations wherein Au electrode films with H/λ of about 0.035 (H represents the thickness of the Au electrode film, and λ represents the wavelength of the surface acoustic wave) are each formed on the LiNbO₃ substrates with the Euler angles of (0°, θ, ψ), (10°, θ, ψ), (20°, θ, ψ), and (30°, θ, ψ).

The reason why Au is preferably used for a metal film is that the transverse bulk wave and the longitudinal bulk wave propagate at a relatively low acoustic speed as compared with Al relatively often used in surface acoustic wave devices, and accordingly, the energy is more readily concentrated in the surface acoustic wave on the surface of the substrate, thereby improving the propagation loss. In FIGS. 1 through 4, calculation was made with φ and θ in the range between 0 to 180° in increments of 2°. Note that the displacement component, which is the subject of preferred embodiments according to the present invention, is a displacement component which has the maximal displacement in the range between the surface of the substrate and the position at a depth of 3λ.

In FIGS. 1 through 4, areas wherein small propagation loss αm of about 0.1 dB/λ or less is effected, are each obtained. That is to say, with the Euler angle in the areas A01 through A17 shown in FIGS. 1 through 4, small propagation loss αm of about 0.1 dB/λ or less is achieved. Table 1 described below shows the areas of A01 through A17 with the Euler angles.

Taking the area A01 shown in Table 1 as an example, the area A01 is an area defined by a rectangle with four corners having the coordinates (1) (0°, 7°, 101°), (2) (0°, 23°, 101°), (3) (0°, 23°, 79°), and (4) (0°, 7°, 79°), wherein the surface acoust wave propagates with the small propagation loss αm of approximately 0.1 dB/λ or less within the area.

Note that while FIGS. 1 through 4 indicate propagation loss with φ of 0°, 10°, 20°, and 30°, the propagation loss within the aforementioned areas is generally about 0.1 dB/λ or less with the deviation of φ in the range between −5 to +5°, in the same way.

As can be clearly understood from a comparison between FIGS. 1 through 4 and FIGS. 5 through 8, the propagation loss on the open-circuit surface is small in the areas A01 through A04 shown in FIG. 1, as well. That is to say, the LiNbO$_3$ substrate with Euler angle in the range of areas A01 through A04 exhibits small propagation loss on the short-circuit surface and the open-circuit surface, and is desirable for surface acoustic wave devices.

Second Preferred Embodiment

Figure 9:
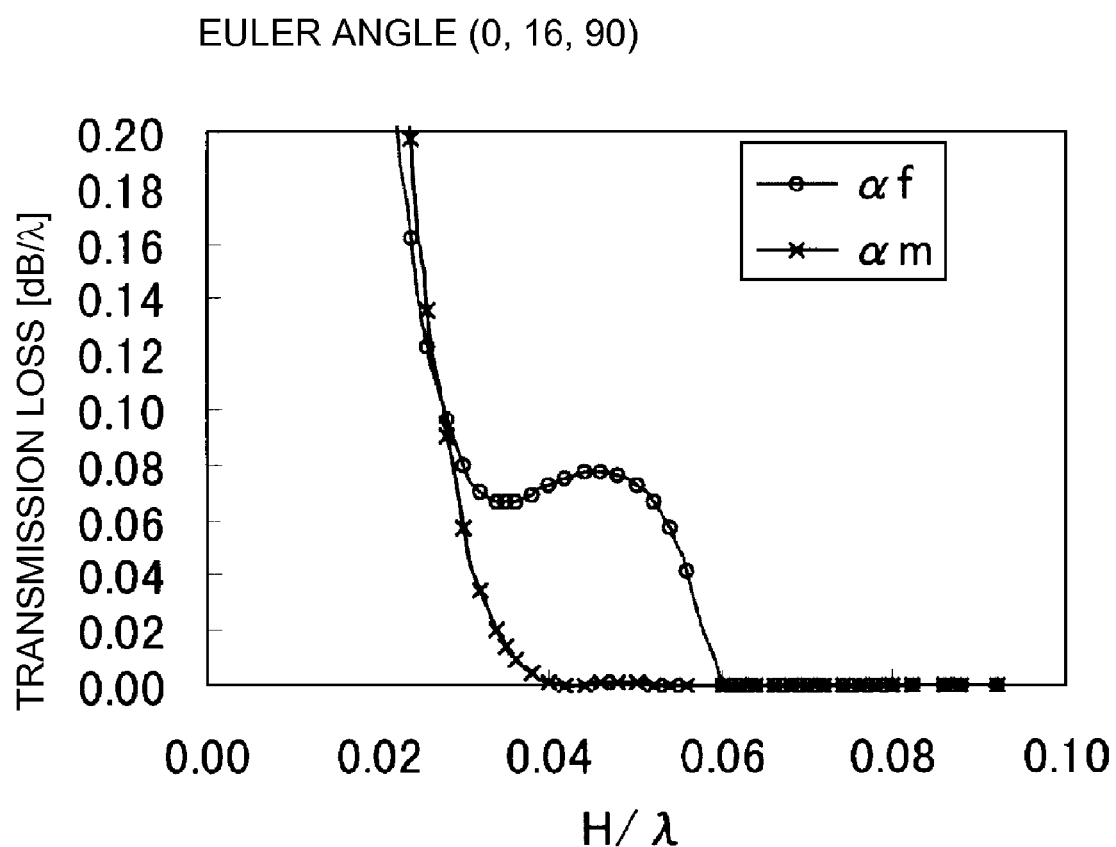
FIG. 9 shows the relationship between the Au electrode film thickness H/λ and the propagation loss αm and αf on the short-circuit surface and the open-circuit surface, with regard to a configuration wherein an Au electrode film is provided on a LiNbO$_3$ substrate with the Euler angles of (0°, 16°, 90°)

Next, the relationship between the propagation properties of the u1-component-dominant surface acoustic wave propagating on a configuration wherein an Au electrode film has been formed on the LiNbO$_3$ substrate with the Euler angle near the aforementioned area A01, the thickness of the Au electrode film, and the Euler angle, has been studied. FIG. 9 shows the relationship between the normalized film

TABLE 1

| AREA | COORDINATES (1) | COORDINATES (2) | COORDINATES (3) | COORDINATES (4) |
| --- | --- | --- | --- | --- |
| AREA A01 | (0°, 7°, 101°) | (0°, 23°, 101°) | (0°, 23°, 79°) | (0°, 7°, 79°) |
| AREA A02 | (0°, 75°, 101°) | (0°, 92°, 101°) | (0°, 92°, 79°) | (0°, 75°, 79°) |
| AREA A03 | (0°, 146°, 155°) | (0°, 168°, 155°) | (0°, 168°, 120°) | (0°, 146°, 120°) |
| AREA A04 | (0°, 146°, 60°) | (0°, 168°, 60°) | (0°, 168°, 25°) | (0°, 146°, 25°) |
| AREA A05 | (10°, 6°, 94°) | (10°, 12°, 94°) | (10°, 23°, 67°) | (10°, 6°, 67°) |
| AREA A06 | (10°, 77°, 96°) | (10°, 93°, 96°) | (10°, 93°, 72°) | (10°, 77°, 72°) |
| AREA A07 | (10°, 139°, 162°) | (10°, 164°, 162°) | (10°, 164°, 107°) | (10°, 139°, 107°) |
| AREA A08 | (10°, 150°, 62°) | (10°, 171°, 62°) | (10°, 171°, 33°) | (10°, 150°, 33°) |
| AREA A09 | (20°, 7°, 84°) | (20°, 24°, 84°) | (20°, 24°, 61°) | (20°, 7°, 61°) |
| AREA A10 | (20°, 78°, 93°) | (20°, 95°, 93°) | (20°, 95°, 46°) | (20°, 78°, 46°) |
| AREA A11 | (20°, 127°, 167°) | (20°, 163°, 167°) | (20°, 163°, 118°) | (20°, 127°, 118°) |
| AREA A12 | (20°, 153°, 67°) | (20°, 172°, 67°) | (20°, 172°, 40°) | (20°, 153°, 40°) |
| AREA A13 | (30°, 10°, 76°) | (30°, 25°, 76°) | (30°, 25°, 51°) | (30°, 10°, 51°) |
| AREA A14 | (30°, 41°, 156°) | (30°, 58°, 156°) | (30°, 58°, 133°) | (30°, 41°, 133°) |
| AREA A15 | (30°, 80°, 93°) | (30°, 100°, 93°) | (30°, 100°, 24°) | (30°, 80°, 24°) |
| AREA A16 | (30°, 139°, 156°) | (30°, 122°, 156°) | (30°, 122°, 133°) | (30°, 139°, 133°) |
| AREA A17 | (30°, 170°, 76°) | (30°, 155°, 76°) | (30°, 155°, 51°) | (30°, 170°, 51°) |

An arrangement with small propagation loss αm small on a short-circuit surface has a particular advantage for a configuration wherein surface acoustic waveguide is formed of an Au electrode film and a configuration wherein a direct wave prevention pattern is formed of an Au electrode film disposed between IDTs. Furthermore, in this case, the propagation loss at the portions of electrode fingers making up an IDT is small, thereby improving the propagation loss of the entire IDT. Furthermore, it has been known that the surface acoustic wave propagating on the IDT propagates while leaking in an exponential manner at a bus bar portion disposed horizontal to the propagation direction of the surface acoustic wave. Accordingly, suppression of the propagation loss at the bus bar portion improves the propagation loss of the entire IDT, as well. Thus, with the present preferred embodiment, the substrate with the Euler angle selected from the aforementioned areas A01 through A17 is used, thereby efficiently improving the propagation loss.

While FIGS. 1 through 4 show the results of the propagation loss αm on the short-circuit surface, FIGS. 5 through 8 indicates the distribution of the propagation loss αf of the u1-component-dominant surface acoustic wave on the open-circuit surface of a configuration wherein Au electrode films have been each formed on the surfaces of the LiNbO$_3$ substrates with the thickness H/λ of about 0.035 with the Euler angles of (0°, θ, ψ), (10°, θ, ψ), (20°, θ, ψ), and (30°, θ, ψ).

thickness H/λ of the Au electrode film and the propagation loss αm and αf on the short-circuit surface and the open-circuit surface in a case of employing the LiNbO$_3$ substrate with the Euler angle of (0°, 16°, 90°). As can be clearly understood from FIG. 9, in the event that H/λ is equal to or greater than about 0.027, the propagation loss αm is about 0.10 dB/λ or less, in the event that H/λ is equal to or greater than about 0.03, the propagation loss αm is about 0.05 dB/λ or less, in the event that H/λ is equal to or greater than about 0.034, the propagation loss αm is about 0.02 dB/λ or less, and in the event that H/λ is equal to or greater than about 0.044, the propagation loss αm is the minimal value.

Note that in the event that H/λ is equal to or less than about 0.06, the surface acoustic wave propagates at a phase speed greater than with the "fast transverse wave" and the "slow transverse wave", and accordingly has few leaky components. On the other hand, in the event that H/λ is equal to or greater than about 0.06, the surface acoustic wave propagates at a phase speed less than with the "fast transverse wave" and the "slow transverse wave", and accordingly, it has been confirmed that the surface acoustic wave propagates with both the propagation loss αm and αf on the short-circuit surface and the open-circuit of zero, but at small phase speeds Vm and Vf of about 3856 m/s and about 4066 m/s, respectively.

On the other hand, in the event that H/λ is about 0.044, it has been confirmed that the surface acoustic wave propagates at great phase speed Vm and Vf of about 4330 m/s and about 4603 m/s, and accordingly, a surface acoustic wave device having such a configuration can easily handle high-frequency signals. Furthermore, in general, Au is an expensive material, and accordingly, the film is preferably formed as thin as possible. Thus, with the present preferred embodiment, the Au electrode film is formed with thickness H/λ in the range between about 0.027 and about 0.06, and accordingly, not only the propagation loss is reduced, but also a surface acoustic wave device having such a configuration can handle high-frequency signals, and furthermore, increase of costs can be avoided.

Figure 10:
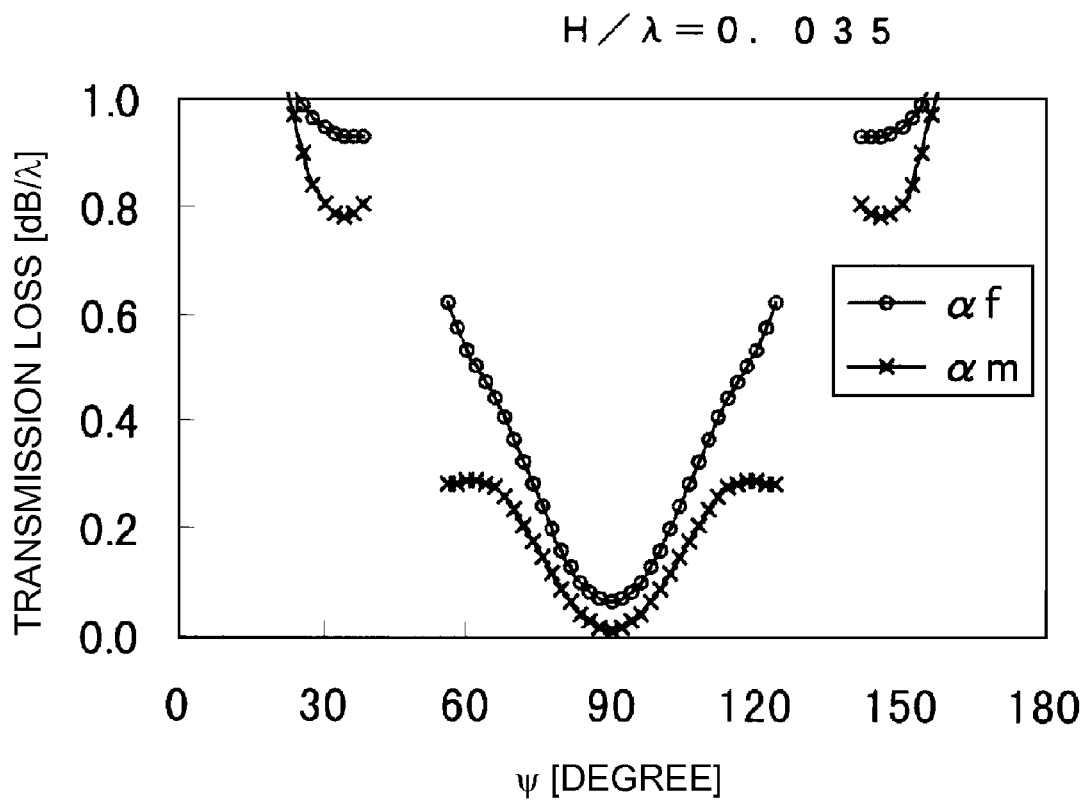
FIG. 10 shows the relationship between ψ and the propagation loss αm and αf on the short-circuit surface and the open-circuit surface, with regard to a configuration wherein an Au electrode film is provided on a LiNbO$_3$ substrate with the Euler angles of (0°, 16°, ψ) and a film thickness H/λ of about 0.035.

FIG. 10 shows the relationship between the Euler angle of (0°, 16°, ψ) of the LiNbO₃ substrate on which the Au electrode film has been formed with the normalized film thickness H/λ of about 0.035 and the propagation loss αm and αf on the short-circuit surface and the open-circuit surface.

As can be clearly understood from FIG. 10, in the event that ψ is in the range between about 79° and about 101°, the propagation loss αm is about 0.10 dB/λ or less on the short-circuit surface, in the event that ψ is in the range between about 83° and about 97°, the propagation loss αm is about 0.05 dB/λ or less, in the event that ψ is in the range between about 87° and about 93°, the propagation loss αm is about 0.02 dB/λ or less, and in the event that ψ is about 90°, the propagation loss αm is the minimal value. On the other hand, in the event that ψ is in the range between about 84° and about 96°, the propagation loss αf is about 0.10 dB/λ or less, and in the event that ψ is about 90°, the propagation loss αf is the minimal value.

Accordingly, it has been discovered that in a case of ψ in the range between about 79° and about 101°, a surface acoustic wave device with propagation loss on the short-circuit am of about 0.10 dB/λ or less surface can be obtained, and furthermore, in a case of ψ in the range between about 84° and about 96°, a surface acoustic wave device with both the propagation loss αm and αf on the short-circuit surface and the open-circuit surface of about 0.10 dB/λ or less can be obtained.

Figure 11:
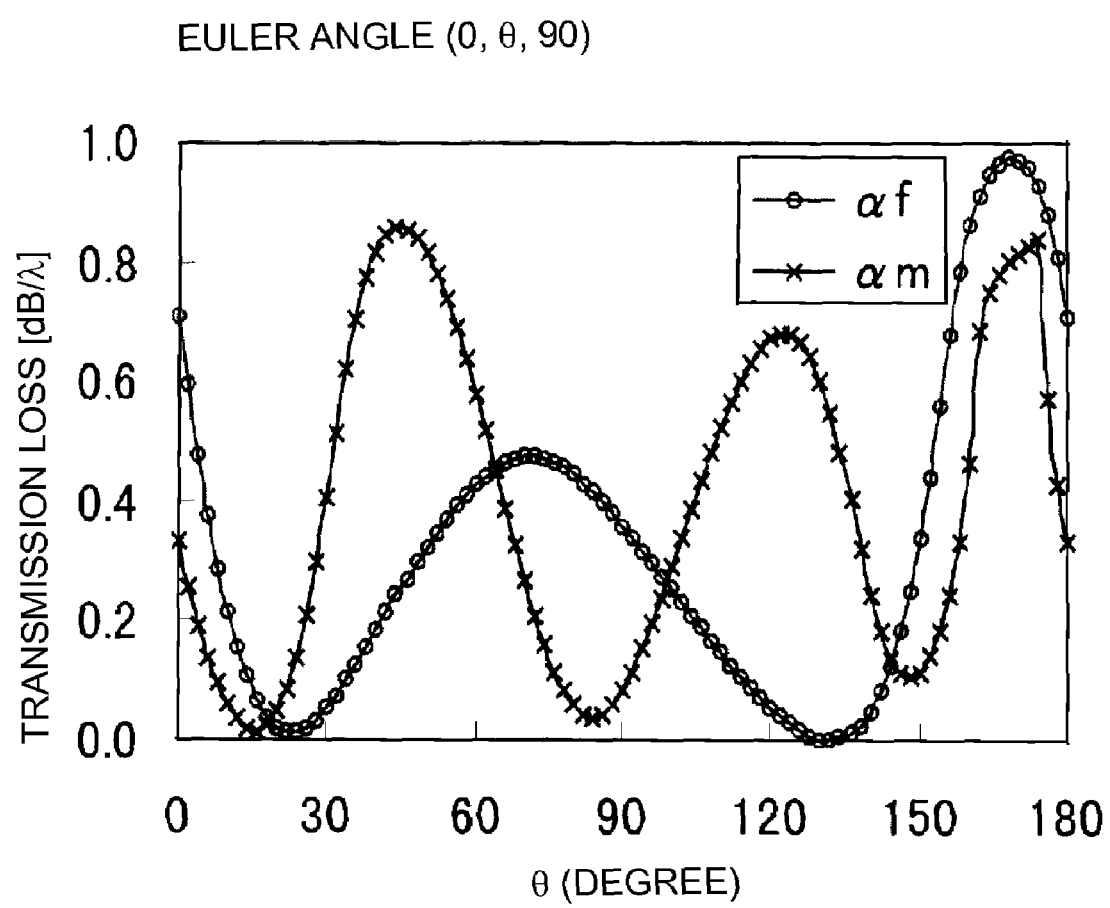
FIG. 11 shows the relationship between θ and the propagation loss αm and αf on the short-circuit surface and the open-circuit surface, with regard to a configuration wherein an Au electrode film is provided on a LiNbO$_3$ substrate with the Euler angles of (0°, 0, 90°) and a film thickness H/λ of about 0.035.

FIG. 11 shows the relationship between the Euler angle of (0°, θ, 90°) of the LiNbO₃ substrate on which the Au electrode film has been formed with the normalized film thickness H/λ of about 0.035 and the propagation loss αm and αf on the short-circuit surface and the open-circuit surface.

As can be clearly understood from FIG. 11, in a case of θ of around 16°, in the event that θ is in the range between about 7° and about 23°, the propagation loss αm is about 0.10 dB/λ or less on the short-circuit surface, in the event that θ is in the range between about 10° and about 21°, the propagation loss αm is about 0.05 dB/λ or less, in the event that θ is in the range between about 13° and about 18°, the propagation loss αm is about 0.02 dB/λ or less, and in the event that θ is about 16°, the propagation loss αm is the minimal value. On the other hand, in the event that θ is in the range between about 14° and about 34°, the propagation loss αf is about 0.10 dB/λ or less on the open-circuit surface, in the event that θ is in the range between about 17° and about 30°, the propagation loss αf is about 0.05 dB/λ or less, in the event that θ is in the range between about 20° and about 27°, the propagation loss αf is about 0.02 dB/λ or less, and in the event that θ is about 24°, the propagation loss αf is the minimal value.

Figure 12:
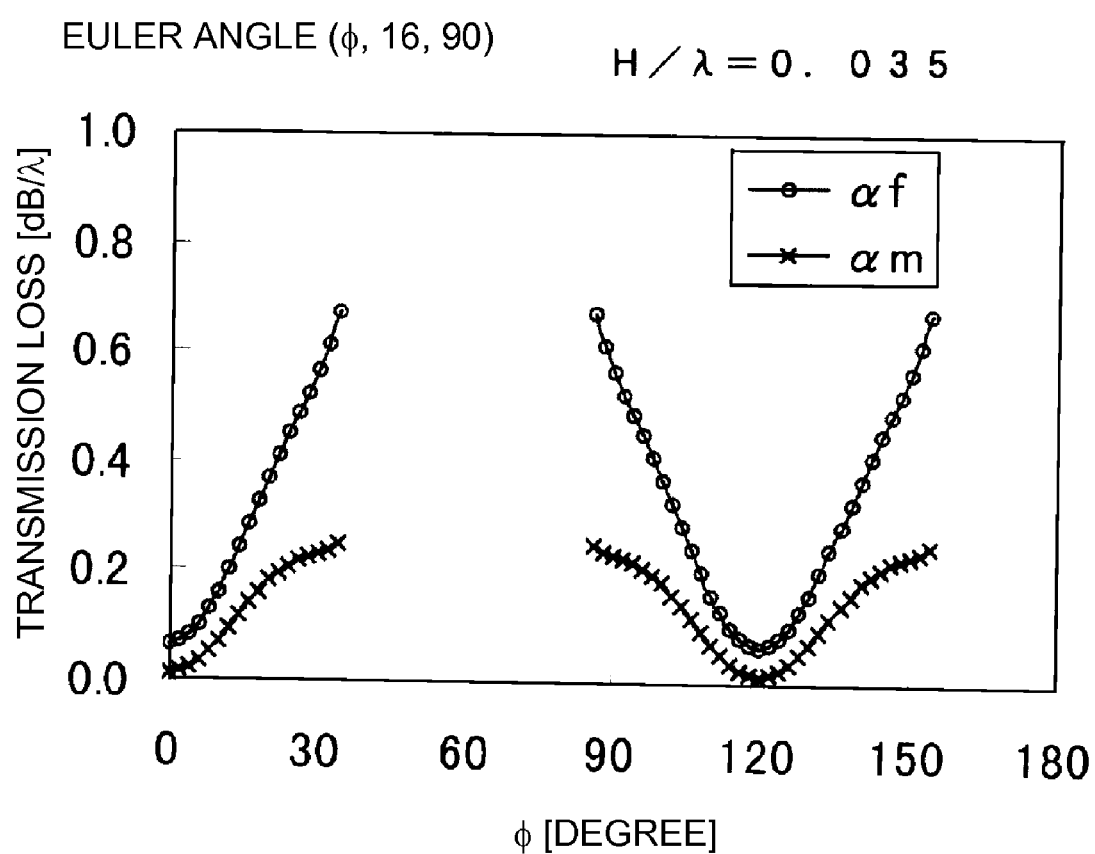
FIG. 12 shows the relationship between φ and the propagation loss αm and αf on the short-circuit surface and the open-circuit surface, with regard to a configuration wherein an Au electrode film is provided on a LiNbO$_3$ substrate with the Euler angles of (φ, 16°, 90°) and a film thickness H/λ of about 0.035.

FIG. 12 shows the relationship between the Euler angle of (φ, 16°, 90°) of the LiNbO₃ substrate on which the Au electrode film has been formed with the normalized film thickness H/λ of about 0.035 and the propagation loss αm and αf on the short-circuit surface and the open-circuit surface.

As can be understood from Expression (1), the relationship $$F(\phi, 16°, 90°) = F(-\phi, 16°, 90°)$$

holds, and accordingly, as can be clearly understood from FIG. 12, in the event that φ is in the range between about −13° and about 13°, the propagation loss αm is about 0.10 dB/λ or less on the short-circuit surface, in the event that φ is in the range between about −8° and about 8°, the propagation loss αm is about 0.05 dB/λ or less, in the event that φ is in the range between about −3° and about 3°, the propagation loss αm is about 0.02 dB/λ or less, and in the event that φ is in the range between about 0° and about 3°, the propagation loss αm is the minimal value.

On the other hand, in the event that φ is in the range between about −6° and about 6°, the propagation loss αf is about 0.10 dB/λ or less on the open-circuit surface, and in the event that φ is 0°, the propagation loss αf is the minimal value.

Figure 13:
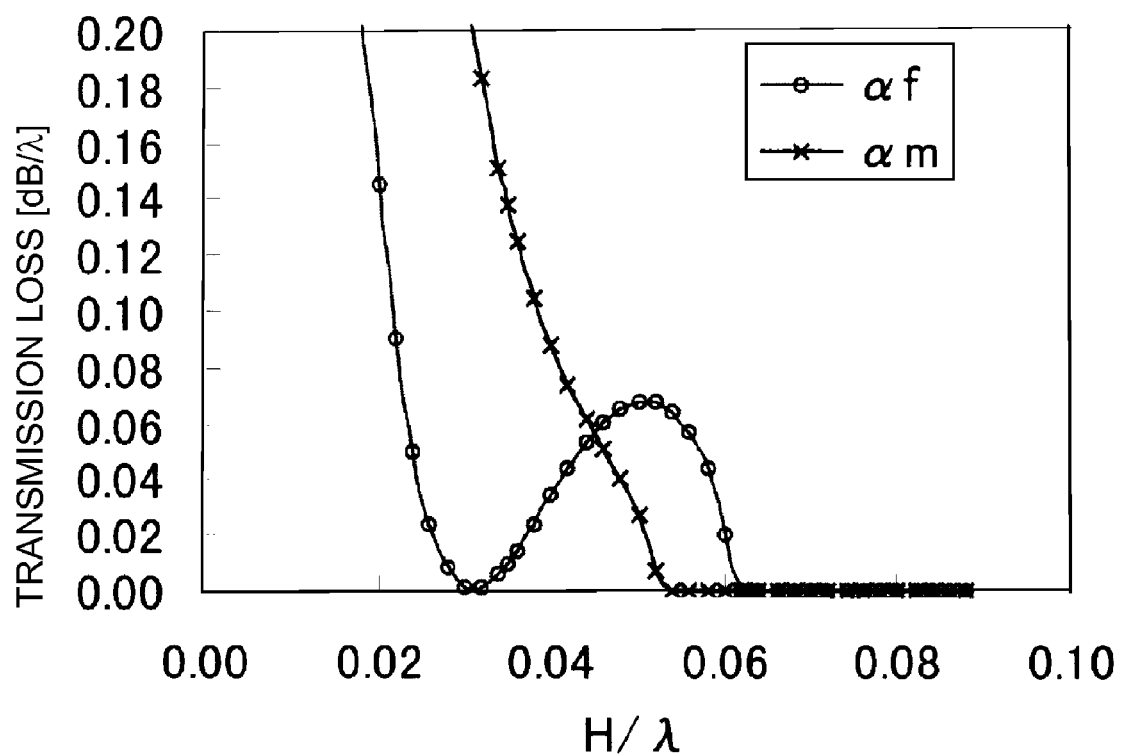
FIG. 13 shows the relationship between the Au electrode film thickness H/λ and the propagation loss αm and αf on the short-circuit surface and the open-circuit surface, with regard to a configuration wherein an Au electrode film is provided on a LiNbO$_3$ substrate with the Euler angles of (0°, 24°, 90°)

FIG. 13 shows the relationship between the normalized film thickness H/λ of the Au electrode film formed on the LiNbO₃ substrate with the Euler angle of (0°, 24°, 90°) and the propagation loss αm and αf on the short-circuit surface and the open-circuit surface.

As can be clearly understood from FIG. 13, in the event that the normalized film thickness H/λ of the Au electrode film is equal to or greater than about 0.038, the propagation loss αm is about 0.10 dB/λ or less on the short-circuit surface. Furthermore, in the event that H/λ is equal to or greater than about 0.046, the propagation loss αm is about 0.05 dB/λ or less, and in the event that H/λ is equal to or greater than about 0.05, the propagation loss αm is about 0.02 dB/λ or less.

On the other hand, with the propagation loss αf on the open-circuit surface, in the event that H/λ is equal to or greater than about 0.022, αf is about 0.10 dB/λ or less. Furthermore, H/λ is more preferably in the range between about 0.024 and about 0.043, and in this case, αf is about 0.05 dB/λ or less.

Note that in the event that H/λ is equal to or greater than about 0.06, the surface acoustic wave propagates at phase speed Vm and Vf on the short-circuit surface and the open-circuit surface, less than with the "fast transverse wave" and the "slow transverse wave", and accordingly, the surface acoustic wave propagates with both the propagation loss αm and αf on the short-circuit surface and the open-circuit being zero, but at a small phase speed Vm and Vf of about 3853 m/s and about 4077 m/s, respectively, and consequently, a surface acoustic wave device having such a configuration has difficulty in handling high-frequency signals. Accordingly, H/λ is preferably adjusted in the range between about 0.038 and about 0.06.

Figure 14:
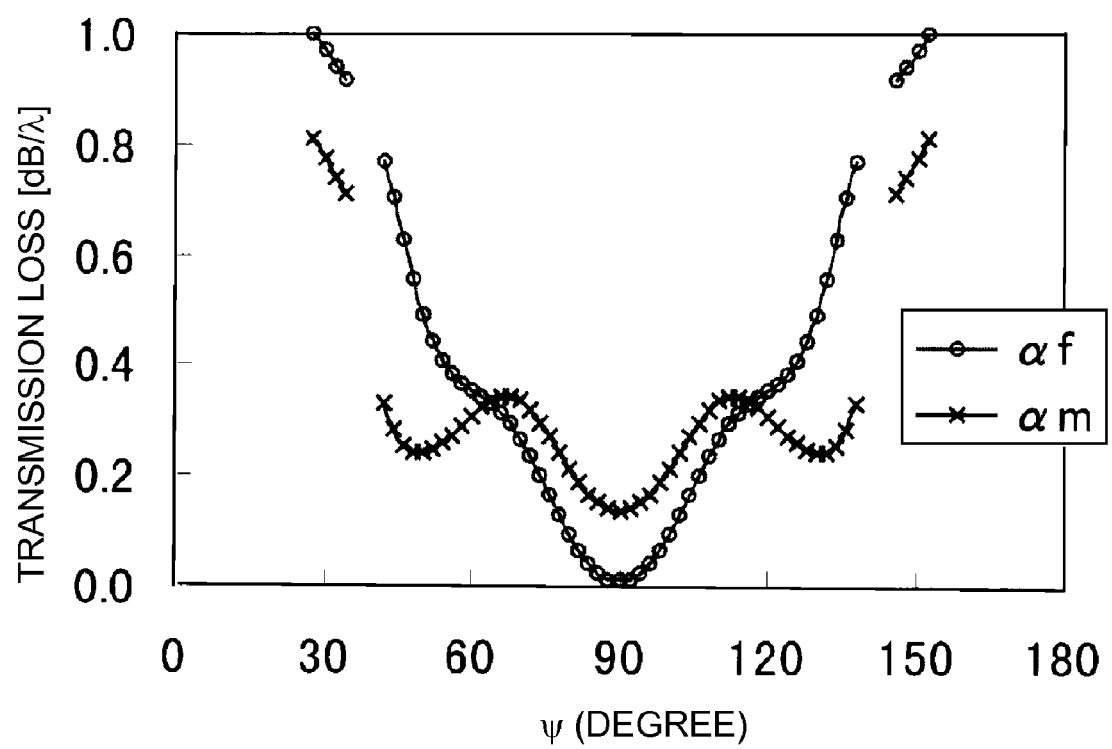
FIG. 14 shows the relationship between ψ and the propagation loss αm and αf on the short-circuit surface and the open-circuit surface, with regard to a configuration wherein an Au electrode film is provided on a LiNbO$_3$ substrate with the Euler angles of (0°, 24°, ψ) and a film thickness H/λ of about 0.035.

FIG. 14 shows the relationship between the Euler angle of (0°, 24°, ψ) of the LiNbO₃ substrate on which the Au electrode film has been formed with the film thickness H/λ of about 0.035 and the propagation loss αm and αf on the short-circuit surface and the open-circuit surface.

As can be clearly understood from FIG. 14, in the event that ψ is in the range between about 84° and about 96°, the surface acoustic wave propagates with a small propagation loss αf of about 0.10 dB/λ or less on the open-circuit surface. On the other hand, in this case, the surface acoustic wave propagates at phase speed Vf and Vm in the range between about 5022 m/s and about 5030 m/s and in the range between about 4662 m/s and about 4664 m/s, respectively. Thus, the present invention provides a surface acoustic wave device which can easily handle high-frequency signals.

Figure 15:
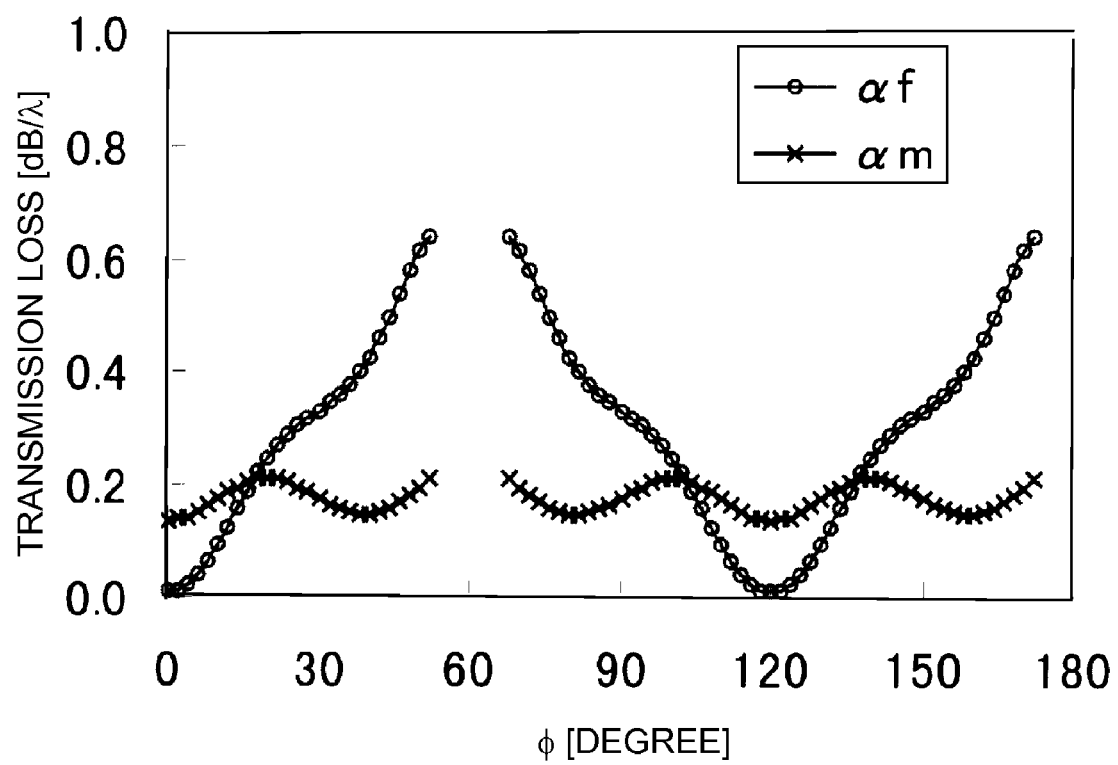
FIG. 15 shows the relationship between φ and the propagation loss αm and αf on the short-circuit surface and the open-circuit surface, with regard to a configuration wherein an Au electrode film is provided on a LiNbO$_3$ substrate with the Euler angles of (φ, 24°, 90°) and a film thickness H/λ of about 0.035.

FIG. 15 shows the relationship between the Euler angle of (φ, 24°, 90°) of the LiNbO$_3$ substrate on which the Au electrode film has been formed with the film thickness H/λ of about 0.035 and the propagation loss αm and αf on the short-circuit surface and the open-circuit surface.

As can be clearly understood from FIG. 15, in the event that φ is in the range between about −6° and about +6°, the surface acoustic wave propagates with propagation loss αm of about 0.15 dB/λ or less, and with propagation loss αf of about 0.05 dB/λ or less. On the other hand, in this case, the surface acoustic wave propagates at phase speed Vf and Vm in the range between about 5023 m/s and about 5030 m/s and in the range between about 4663 m/s and about 4664 m/s, respectively. Thus, a surface acoustic wave device having such a configuration can easily handle high-frequency signals.

Third Preferred Embodiment

Next, the relationship between the propagation properties of the u1-component-dominant surface acoustic wave propagating on a configuration wherein an Au electrode film has been formed on the LiNbO$_3$ substrate with the Euler angle around (30°, 90°, 45°), the thickness of the Au electrode film, and the Euler angle, has been studied.

Figure 16:
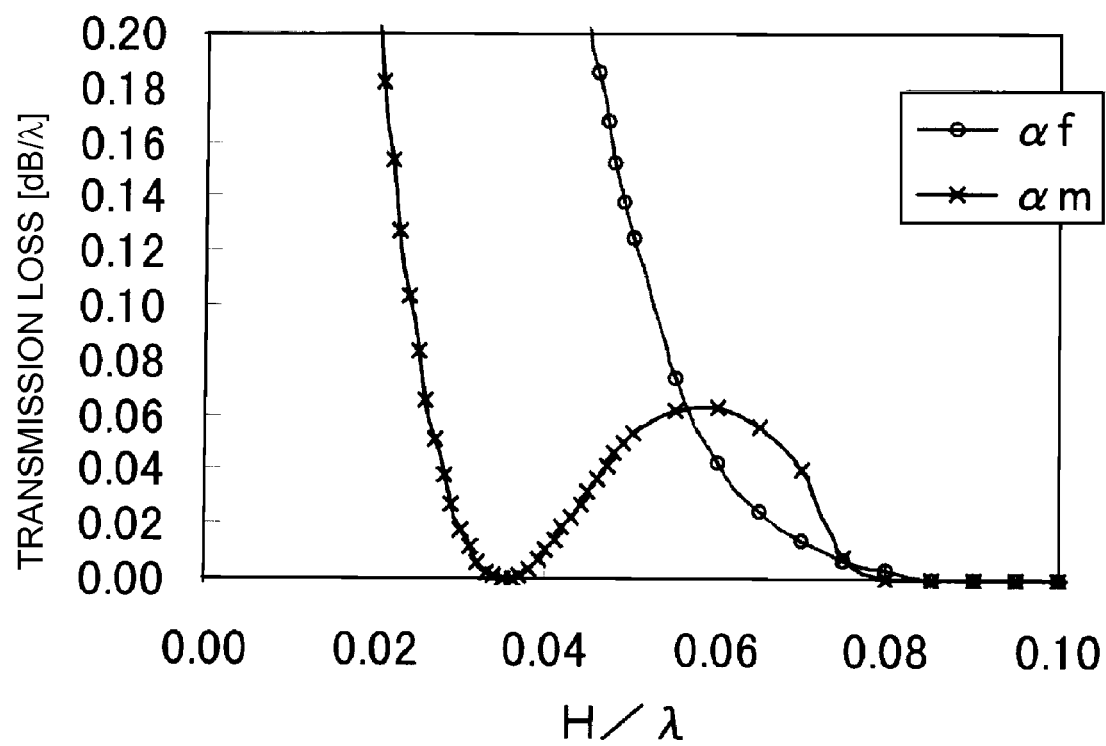
FIG. 16 shows the relationship between the Au electrode film thickness H/λ and the propagation loss αm and αf on the short-circuit surface and the open-circuit surface, with regard to a configuration wherein an Au electrode film is provided on a LiNbO$_3$ substrate with a Euler angles of (30°, 90°, 45°)

FIG. 16 shows the relationship between the normalized film thickness H/λ of the Au electrode film formed on the LiNbO$_3$ substrate with the Euler angle of (30°, 90°, 45°) and the propagation loss αm and αf on the short-circuit surface and the open-circuit surface. As can be clearly understood from FIG. 16, in the event that H/λ is equal to or greater than about 0.024, the propagation loss αm is about 0.10 dB/λ or less, in the event that H/λ is in the range between about 0.0264 and about 0.0449, αm is about 0.05 dB/λ or less, in the event that H/λ is in the range between about 0.0298 and about 0.0424, αm is about 0.02 dB/λ or less, and in the event that H/λ is about 0.035, αm is the minimal value.

Note that the "slow transverse wave" propagates at a phase speed of about 3536 m/s, and the "fast transverse wave" propagates at a phase speed of about 4121 m/s, on the substrate with the Euler angle of (30°, 90°, 45°). On the other hand, in the event that H/λ is greater than about 0.08, the surface acoustic wave propagates at a phase speed less than with the "fast transverse wave" and the "slow transverse wave", and accordingly, the surface acoustic wave propagates with both the transmission loss αm and αf on the short-circuit surface and on the open-circuit surface of zero, but at a phase speed Vm and Vf on the short-circuit surface and on the open-circuit surface slower than about 3536 m/s.

On the other hand, in the event that H/λ is about 0.035, the surface acoustic wave propagates at high phase speed Vm and Vf on the short-circuit surface and on the open-circuit surface of about 4693 m/s and about 5008 m/s, respectively, and thus, a surface acoustic device having such a configuration can easily handle high-frequency signals. Thus, with the surface acoustic device according to the present preferred embodiment, the Au electrode film is formed with the film thickness H/λ in the range between about 0.024 and about 0.035, and thus, not only the propagation loss is reduced, but also the surface acoustic device can handle high-frequency signals, and furthermore, increase of costs can be avoided.

Figure 17:
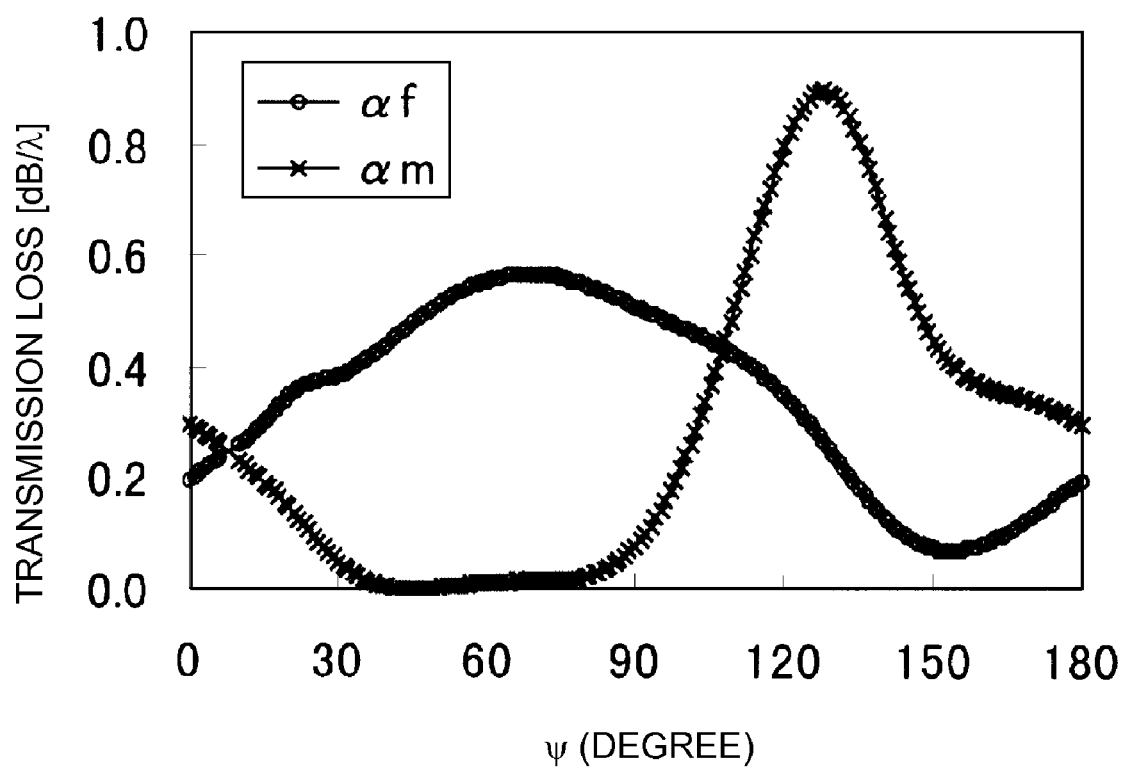
FIG. 17 shows the relationship between ψ and the propagation loss αm and αf on the short-circuit surface and the open-circuit surface, with regard to a configuration wherein an Au electrode film is provided on a LiNbO$_3$ substrate with the Euler angles of (30°, 90°, ψ) and a film thickness H/λ of about 0.035.

FIG. 17 shows the relationship between the Euler angle of (30°, 90°, ψ) of the LiNbO$_3$ substrate on which the Au electrode film has been formed with the normalized film thickness H/λ of about 0.035 and the propagation loss αm and αf on the short-circuit surface and the open-circuit surface.

As can be clearly understood from FIG. 17, in the event that ψ is in the range between about 24.5° and about 91.8°, the propagation loss αm is about 0.10 dB/λ or less on the short-circuit surface, in the event that ψ is in the range between about 29.8° and about 86.8°, the propagation loss αm is about 0.05 dB/λ or less, in the event that ψ is in the range between about 34.5° and about 79.0°, the propagation loss αm is about 0.02 dB/λ or less, and in the event that ψ is about 45°, αm is the minimal value.

Figure 18:
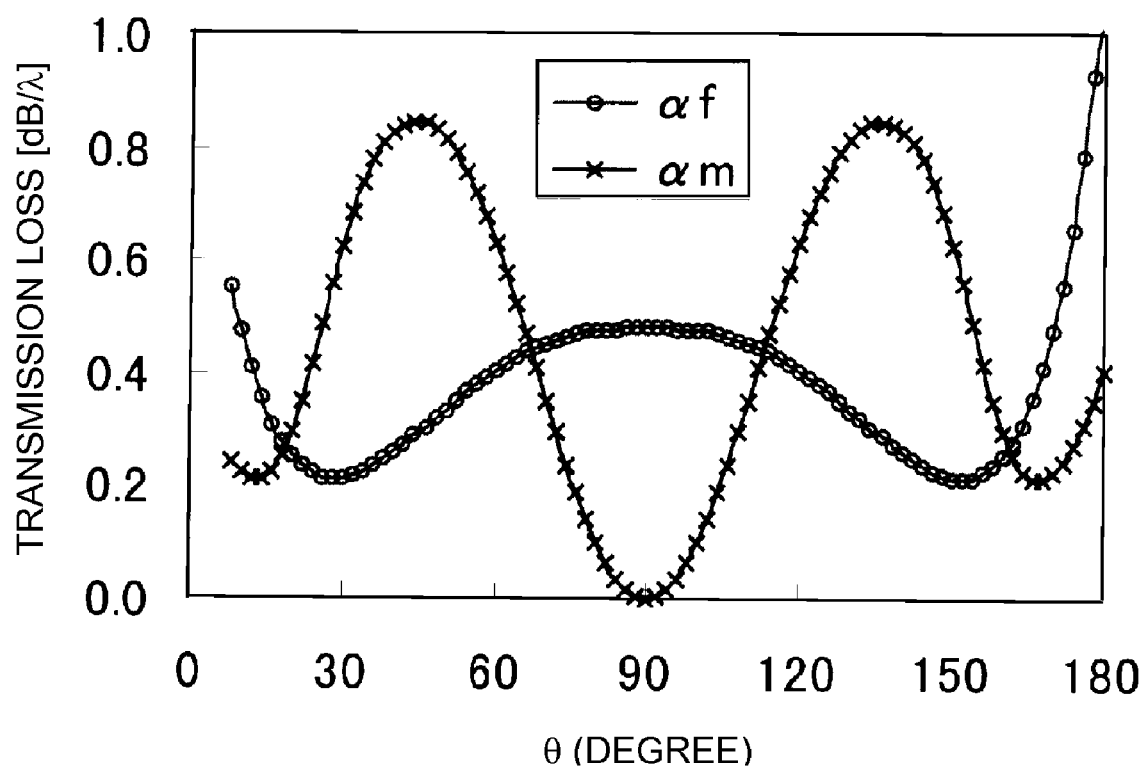
FIG. 18 shows the relationship between θ and the propagation loss αm and αf on the short-circuit surface and the open-circuit surface, with regard to a configuration wherein an Au electrode film is provided on a LiNbO$_3$ substrate with the Euler angle of (30°, θ, 45°) and a film thickness H/λ of about 0.035.

FIG. 18 shows the relationship between the Euler angle of (30°, θ, 45°) of the LiNbO$_3$ substrate on which the Au electrode film has been formed with the normalized film thickness H/λ of about 0.035 and the propagation loss αm and αf on the short-circuit surface and the open-circuit surface.

As can be clearly understood from FIG. 18, in the event that θ is in the range between about 80° and about 100°, the propagation loss αm is about 0.10 dB/λ or less, in the event that θ is in the range between about 83° and about 97°, the propagation loss αm is about 0.05 dB/λ or less, in the event that θ is in the range between about 85.5° and about 94.5°, the propagation loss αm is about 0.02 dB/λ or less, and in the event that θ is about 90°, the propagation loss αm is the minimal value.

Figure 19:
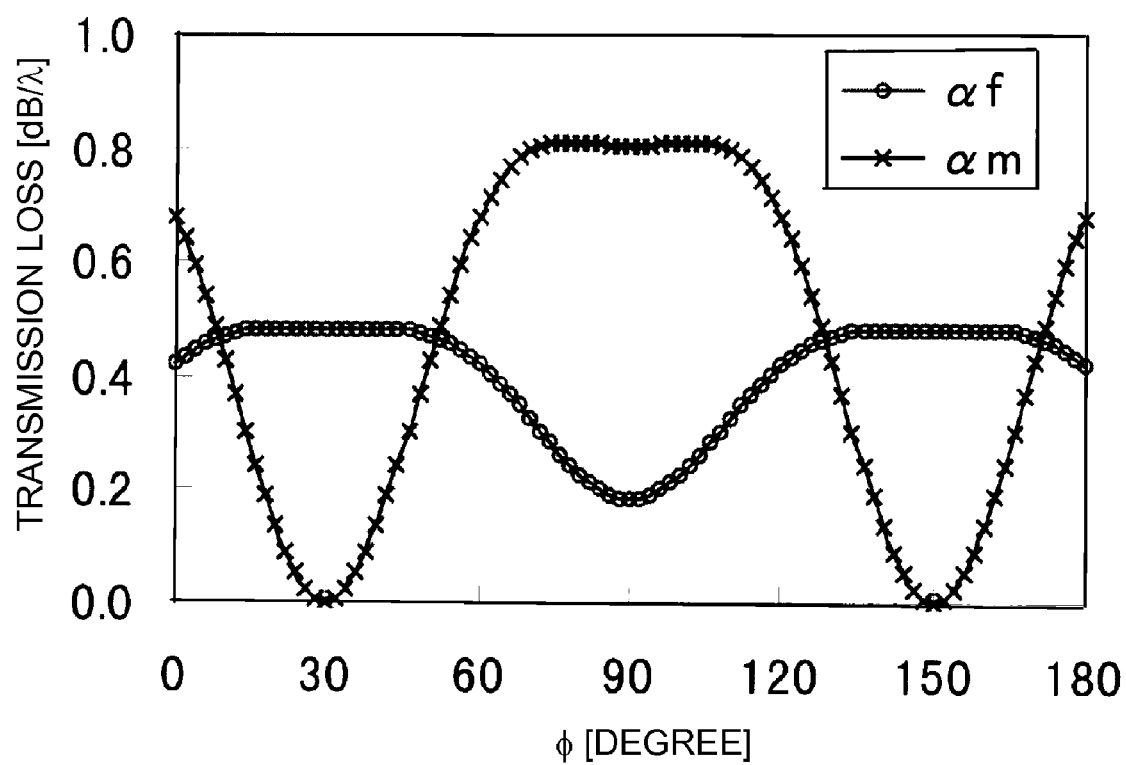
FIG. 19 shows the relationship between φ and the propagation loss αm and αf on the short-circuit surface and the open-circuit surface, with regard to a configuration wherein an Au electrode film is provided on a LiNbO$_3$ substrate with the Euler angle of (φ, 90°, 45°) and a film thickness H/λ of about 0.035.

FIG. 19 shows the relationship between the Euler angle of (φ, 90°, 45°) of the LiNbO$_3$ substrate on which the Au electrode film has been formed with the normalized film thickness H/λ of about 0.035 and the propagation loss αm and αf on the short-circuit surface and the open-circuit surface.

As can be clearly understood from FIG. 19, in the event that φ is in the range between about 21.5° and about 38.5°, the propagation loss αm is about 0.10 dB/λ or less on the short-circuit surface, in the event that φ is in the range between about 24° and about 36°, the propagation loss αm is about 0.05 dB/λ or less, in the event that φ is in the range between about 26.5° and about 33.5°, the propagation loss αm is about 0.02 dB/λ or less, and in the event that φ is about 30°, the propagation loss αm is the minimal value.

Figure 3:
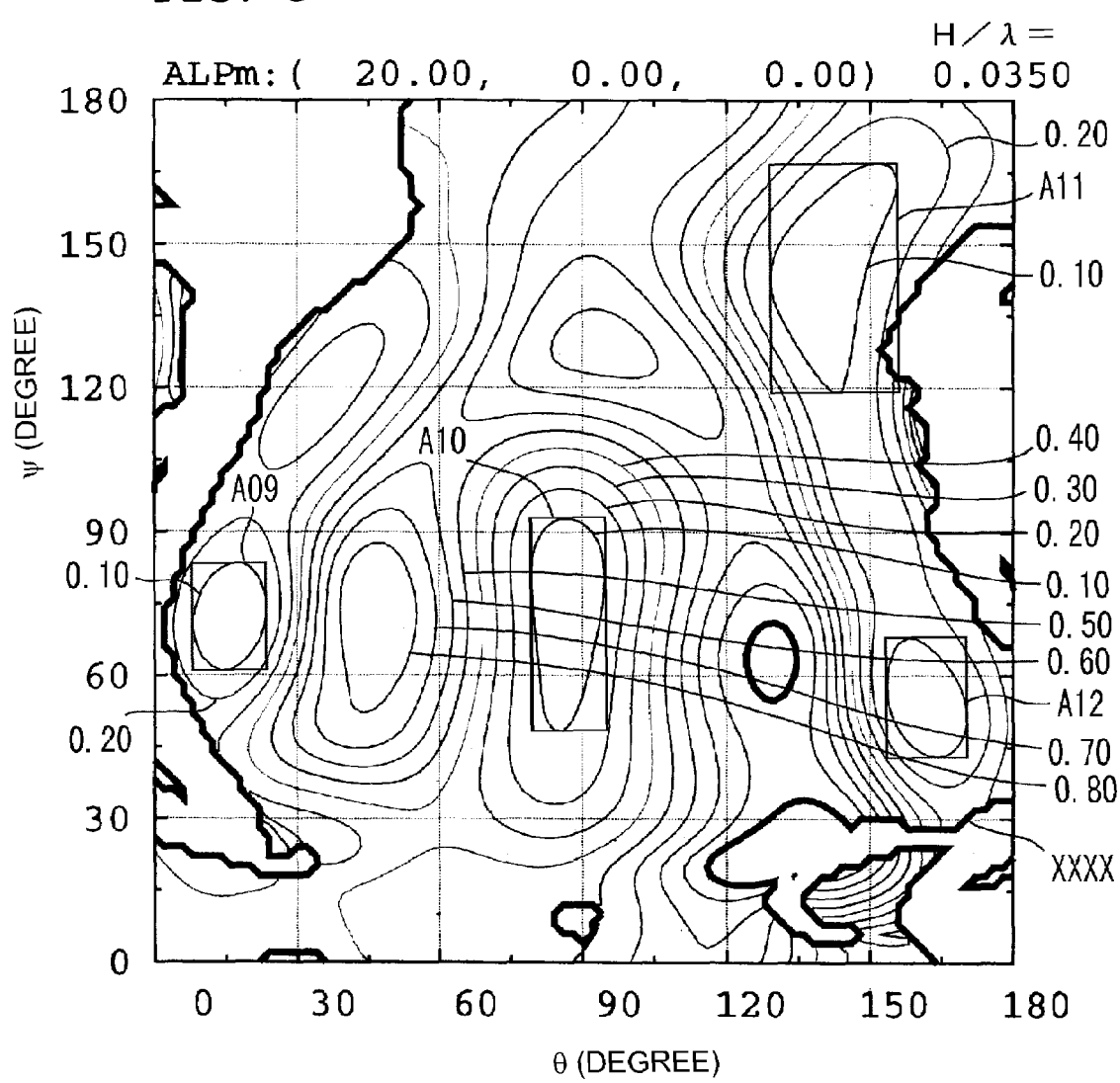
FIG. 3 shows the relationship between the propagation loss αm of the u1-component-dominant surface acoustic wave propagating on the short-circuit surface and the Euler angles, with regard to a configuration wherein an Au electrode film is provided on a LiNbO$_3$ substrate with the Euler angles of (20°, θ, ψ) and a film thickness H/λ of about 0.035.
Figure 4:
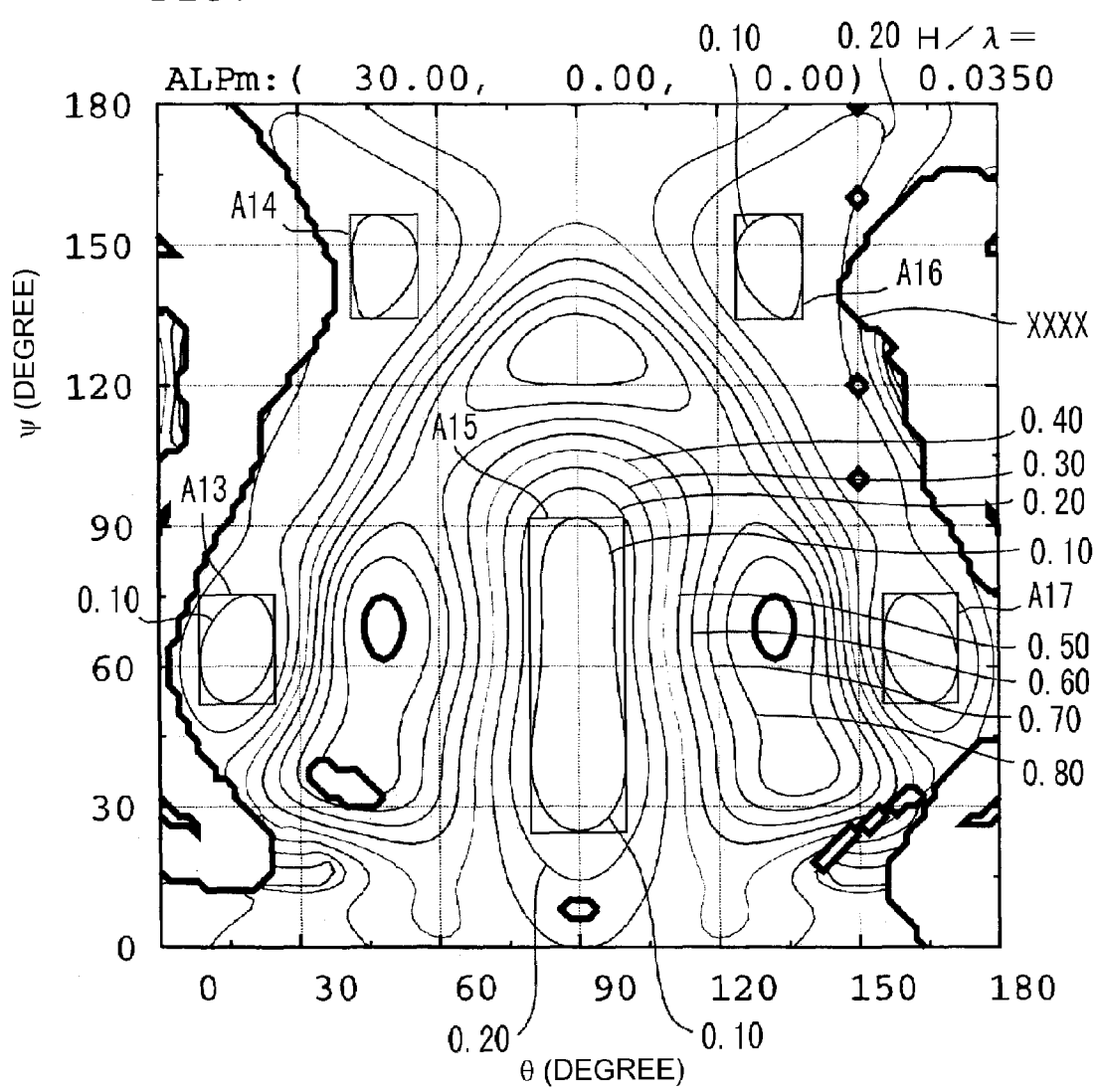
FIG. 4 shows the relationship between the propagation loss αm of the u1-component-dominant surface acoustic wave propagating on the short-circuit surface and the Euler angles, with regard to a configuration wherein an Au electrode film is formed on a LiNbO$_3$ substrate with the Euler angles of (30°, θ, ψ) and a film thickness H/λ of about 0.035.
Figure 5:
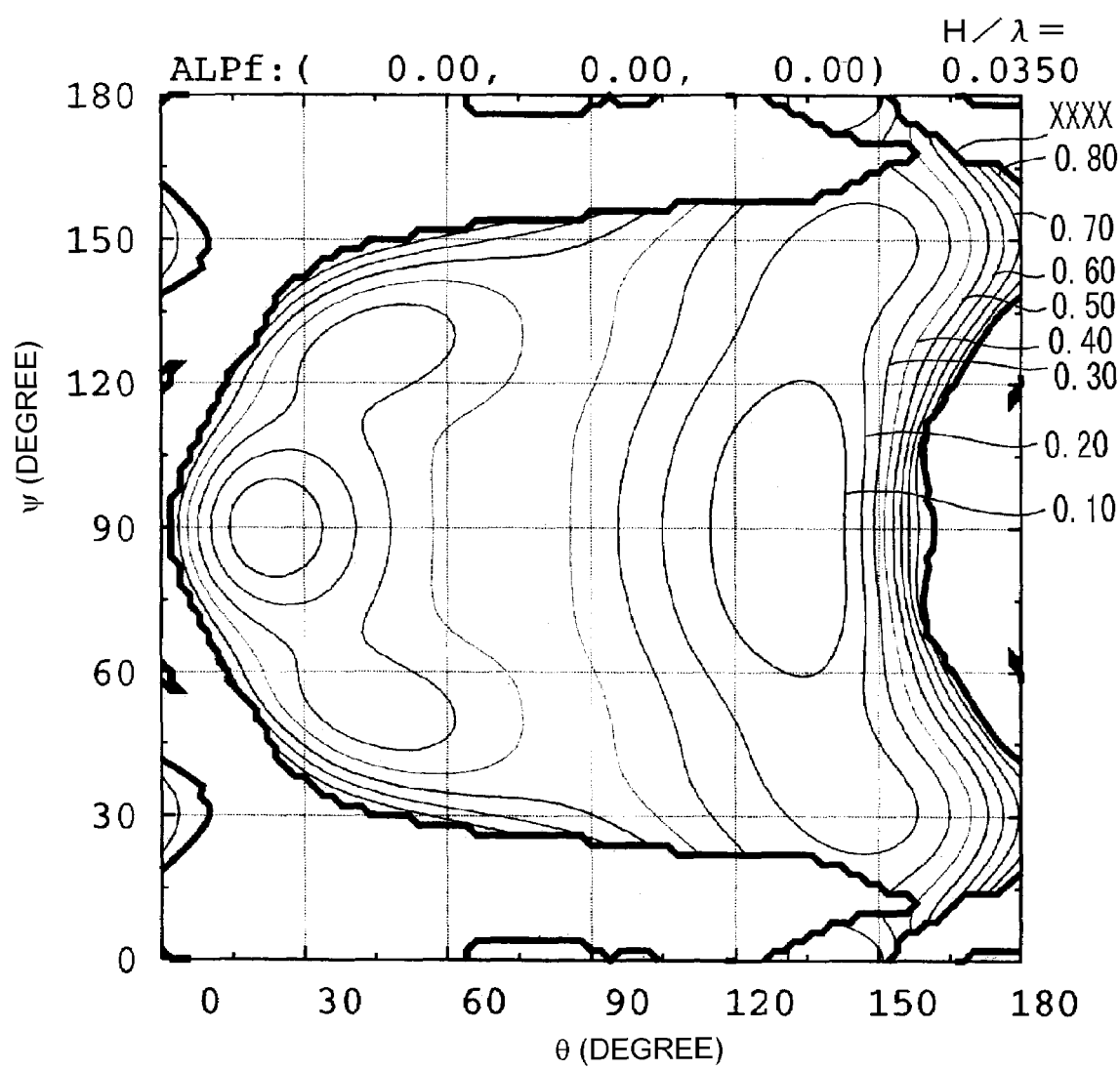
FIG. 5 shows the relationship between the propagation loss αf of the u1-component-dominant surface acoustic wave propagating on the open-circuit surface and the Euler angles, with regard to a configuration wherein an Au electrode film is provided on a LiNbO$_3$ substrate with the Euler angles of (0°, θ, ψ) and a film thickness H/λ of about 0.035.
Figure 6:
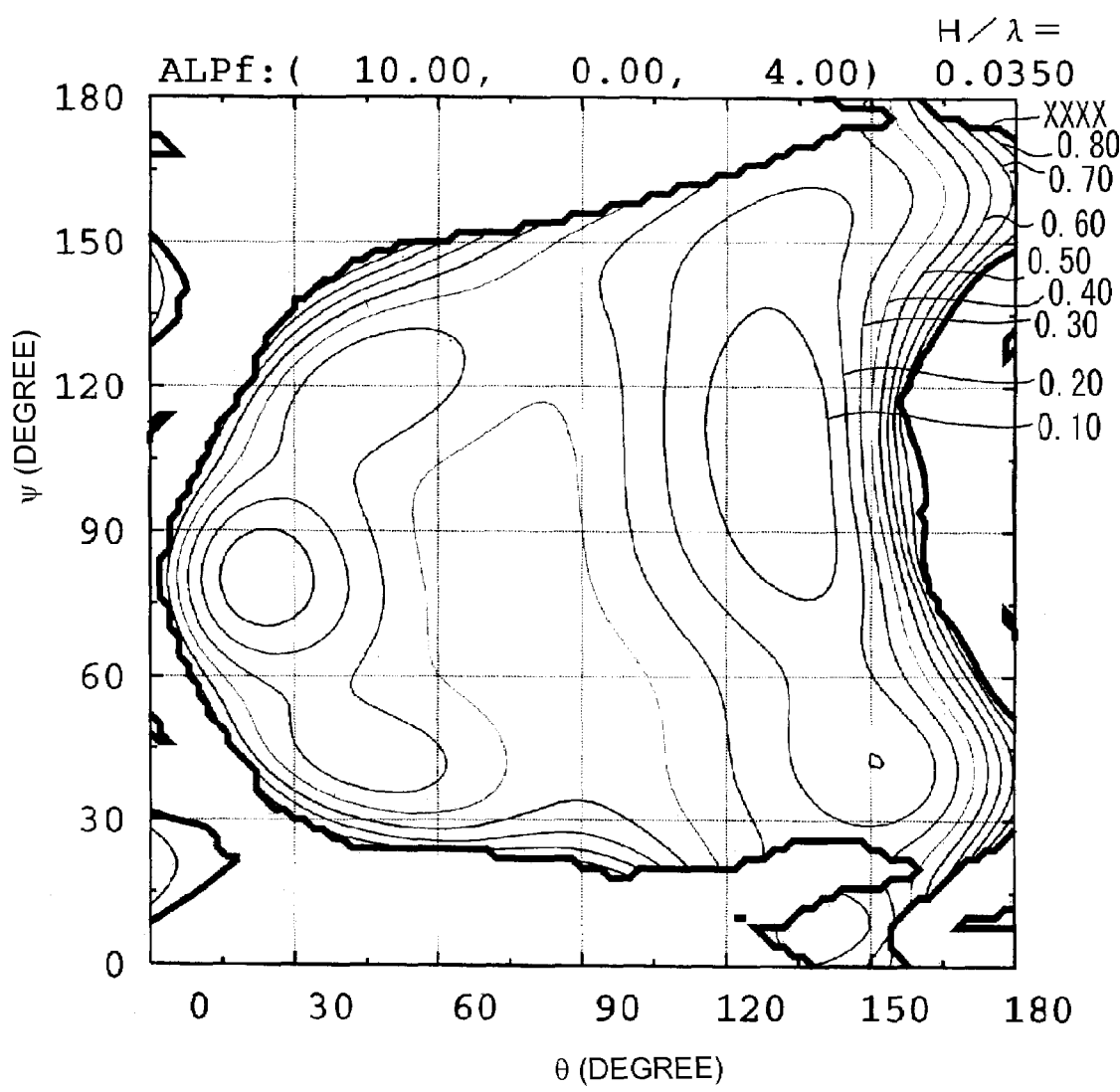
FIG. 6 shows the relationship between the propagation loss αf of the u1-component-dominant surface acoustic wave propagating on the open-circuit surface and the Euler angles, with regard to a configuration wherein an Au electrode film is provided on a LiNbO$_3$ substrate with the Euler angles of (10°, θ, ψ) and a film thickness H/λ of about 0.035.
Figure 7:
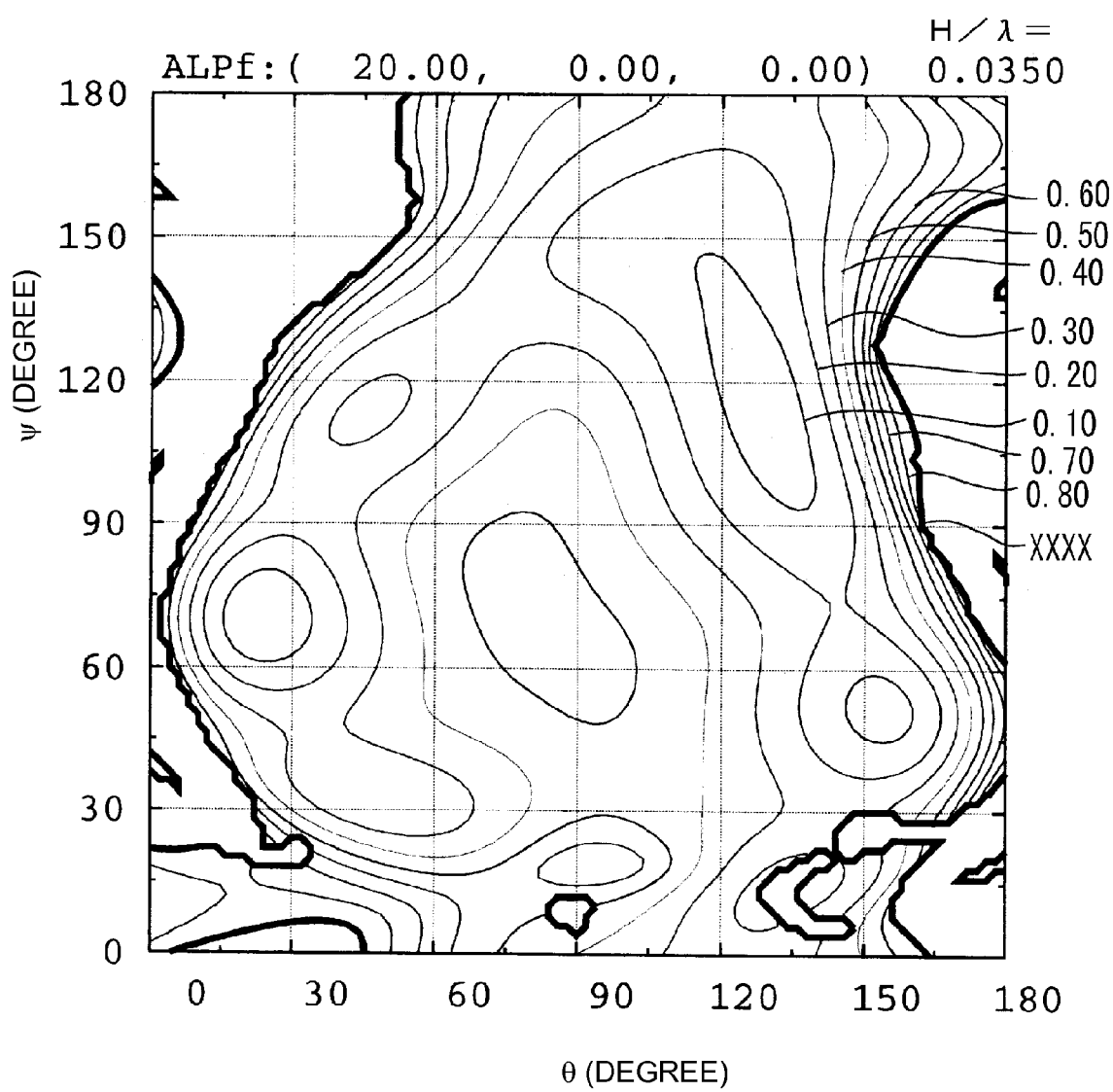
FIG. 7 shows the relationship between the propagation loss αf of the u1-component-dominant surface acoustic wave propagating on the open-circuit surface and the Euler angles, with regard to a configuration wherein an Au electrode film is provided on a LiNbO$_3$ substrate with the Euler angles of (20°, θ, ψ) and a film thickness H/λ of about 0.035.
Figure 8:
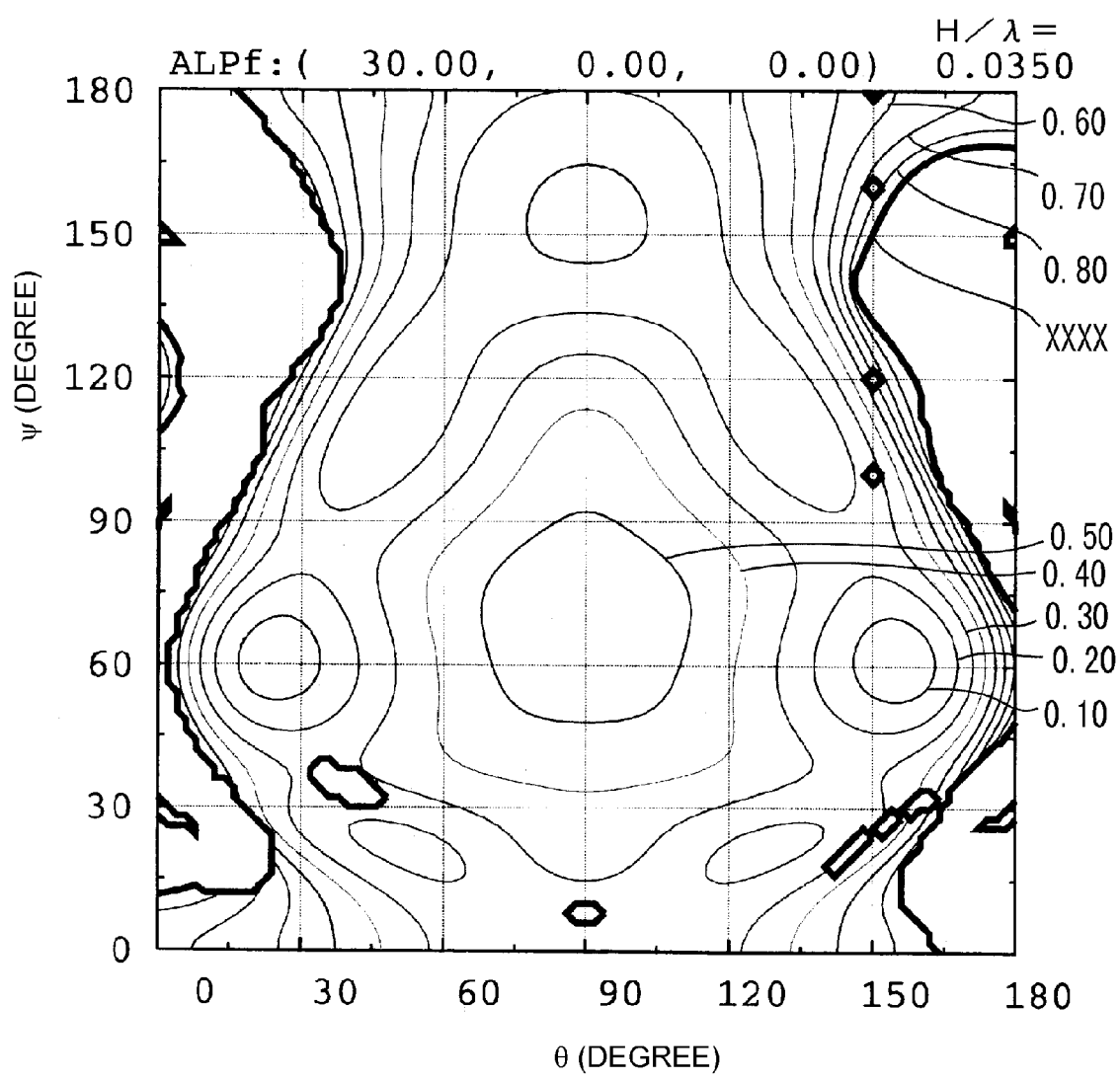
FIG. 8 shows the relationship between the propagation loss αf of the u1-component-dominant surface acoustic wave propagating on the open-circuit surface and the Euler angles, with regard to a configuration wherein an Au electrode film is provided on a LiNbO$_3$ substrate with the Euler angles of (30°, θ, ψ) and a film thickness H/λ of about 0.035.

As can be understood from FIGS. 3 and 4, the dependence of the propagation loss αm upon φ and θ with the Euler angle around (30°, 90°, 81.6°) is similar to that with the Euler angle around (30°, 90°, 45°). On the other hand, the second leaky surface acoustic wave propagates at a phase speed Vm and Vf, slower than the "fast transverse wave" and the "slow transverse wave" on the LiNbO$_3$ substrate with the Euler angle of (30°, 90°, 81.6°) on which the Au electrode film has been formed with the film thickness H/λ greater than about 0.08.

Thus, with the surface acoustic wave device according to the present preferred embodiment, the Au electrode film is preferably formed such that the film thickness H/λ is in the range between about 0.0292 and about 0.08, whereby the propagation loss αm can be suppressed to about 0.01 dB/λ or less.

Fourth Preferred Embodiment

Figure 20:
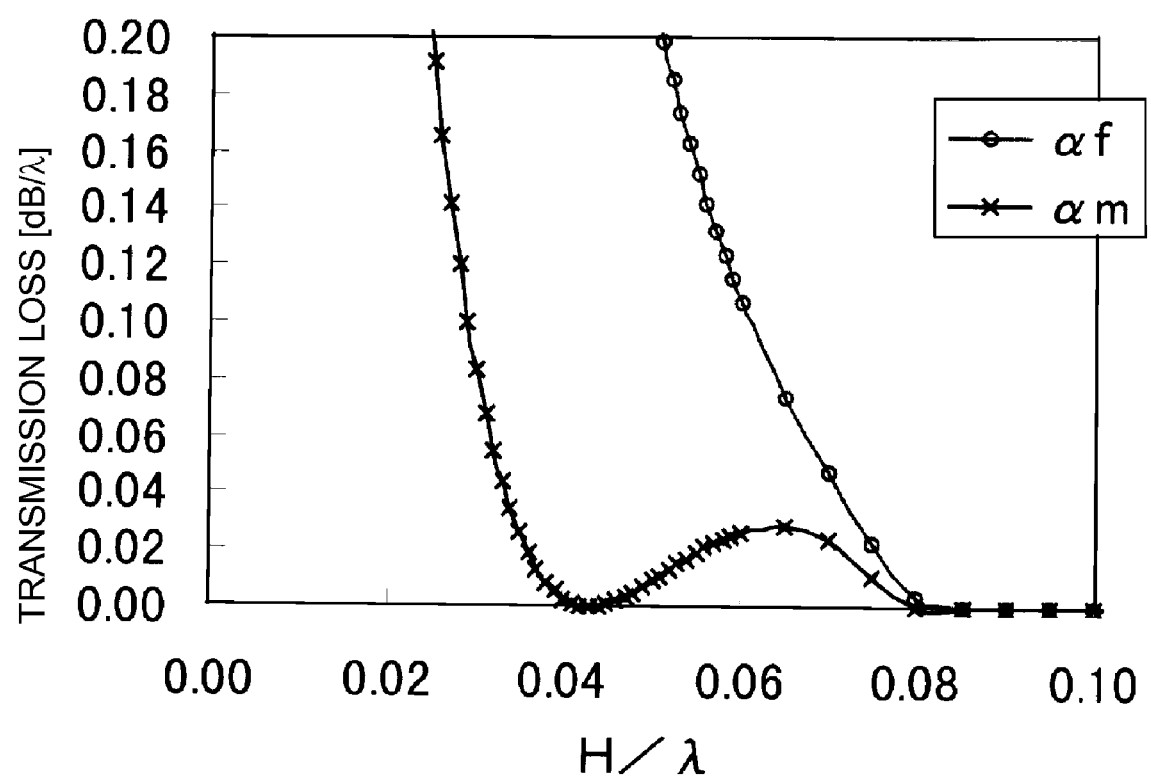
FIG. 20 shows the relationship between the Au electrode film thickness H/λ and the propagation loss αm and αf on the short-circuit surface and the open-circuit surface, with regard to a configuration wherein an Au electrode film is provided on a LiNbO$_3$ substrate with the Euler angles of (30°, 90°, 81.6°)

Next, the relationship between the propagation properties of the u1-component-dominant surface acoustic wave propagating on a configuration wherein an Au electrode film has been formed on the LiNbO$_3$ substrate with the Euler angle around (30°, 90°, 81.6°), the thickness of the Au electrode film, and the Euler angle, has been studied. FIG. 20 shows the relationship between the normalized film thickness H/λ of the Au electrode film formed on the LiNbO$_3$ substrate with the Euler angle of (30°, 90°, 81.6°) and the propagation loss αm and αf on the short-circuit surface and the open-circuit surface. As can be clearly understood from FIG. 20, in the event that H/λ is equal to or greater than about 0.0292, the propagation loss αm is about 0.10 dB/λ or less, in the event that H/λ is equal to or greater than about 0.0325, αm is 0.05 dB/λ or less, in the event that H/λ is equal to or greater than about 0.0358, αm is about 0.02 dB/λ or less, and in the event that H/λ is equal to or greater than about 0.043, αm is the minimal value.

Figure 21:
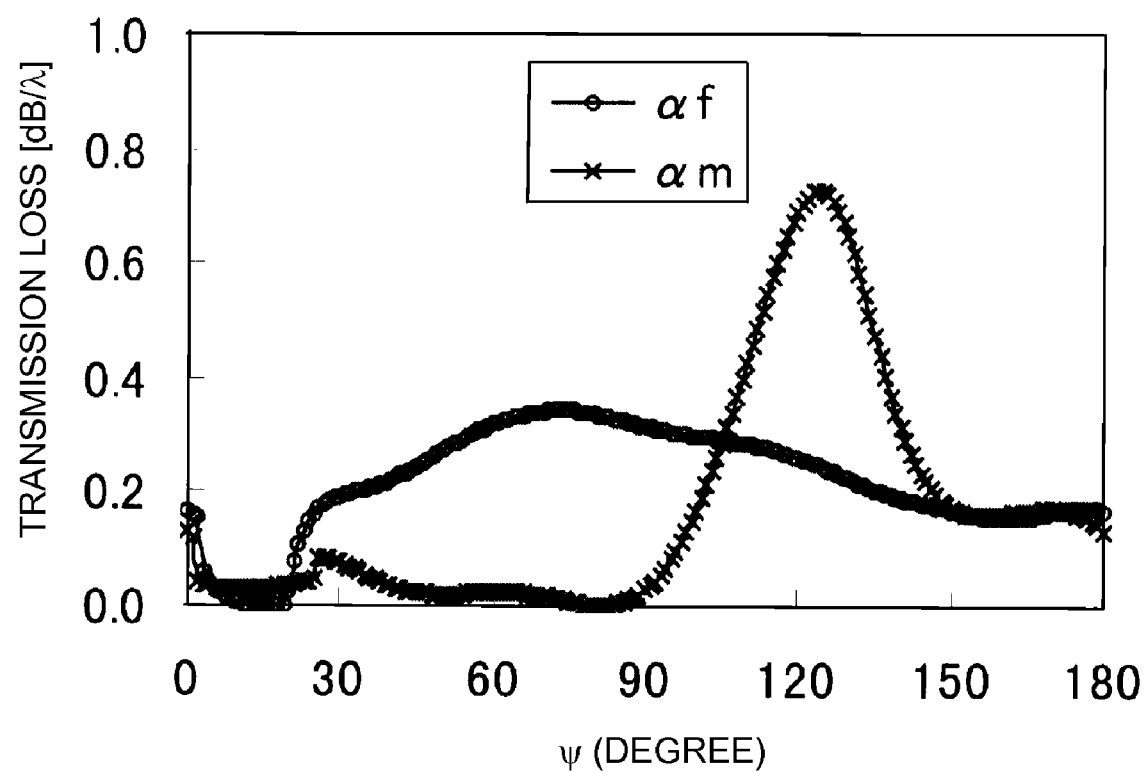
FIG. 21 shows the relationship between ψ and the propagation loss αm and αf on the short-circuit surface and the open-circuit surface, with regard to a configuration wherein an Au electrode film is provided on a LiNbO$_3$ substrate with the Euler angles of (30°, 90°, ψ) and a film thickness H/λ of about 0.044.

FIG. 21 shows the relationship between the Euler angle of (30°, 90°, ψ) of the LiNbO$_3$ substrate on which the Au electrode film has been formed with the normalized film thickness H/λ of about 0.044 and the propagation loss αm and αf on the short-circuit surface and the open-circuit surface.

As can be clearly understood from FIG. 21, in the event that ψ is in the range between about 1° and about 96.5°, the propagation loss αm is about 0.10 dB/λ or less on the short-circuit surface, in the event that ψ is in the range between about 1.8° and about 92.5°, the propagation loss αm is about 0.05 dB/λ or less, in the event that ψ is in the range between about 67.2° and about 88.8°, the propagation loss αm is about 0.02 dB/λ or less, and in the event that ψ is about 81.6°, the propagation loss αm is the minimal value. On the other hand, in the event that ψ is in the range between about 67.2° and about 88.8°, the propagation loss αm is about 0.02 dB/λ or less, and in the event that ψ is about 81.6°, the propagation loss αm is the minimal value. On the other hand, in the event that ψ is in the range between about 84° and about 96°, the propagation loss αm on the open-circuit surface is about 0.10 dB or less, and αf on the open-circuit surface is the minimal value with ψ of about 90°.

Thus, with the surface acoustic wave device according to the present preferred embodiment, the LiNbO$_3$ substrate with ψ in the range between about 10° and about 96.5° of the Euler angle of (30°, 90°, ψ) is used, whereby the propagation loss αm can be suppressed to about 0.01 dB/λ or less.

Fifth Preferred Embodiment

Figure 22:
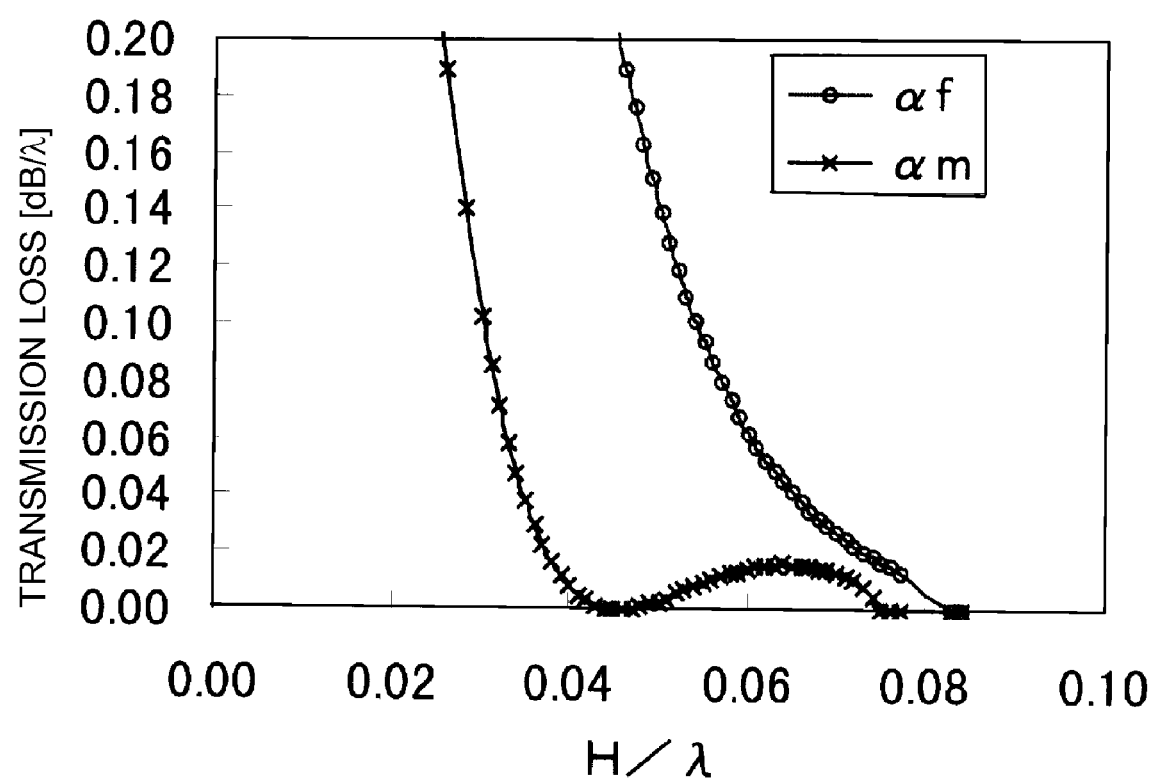
FIG. 22 shows the relationship between the Au electrode film thickness H/λ and the propagation loss αm and αf on the short-circuit surface and the open-circuit surface, with regard to a configuration wherein an Au electrode film is provided on a LiNbO$_3$ substrate with the Euler angles of (0°, 84°, 90°)

Next, the relationship between the propagation properties of the u1-component-dominant surface acoustic wave propagating on a configuration wherein an Au electrode film has been formed on the LiNbO$_3$ substrate with the Euler angle around (0°, 84°, 90°), the thickness of the Au electrode film, and the Euler angle, has been studied. FIG. 22 shows the relationship between the normalized film thickness H/λ of the Au electrode film formed on the LiNbO$_3$ substrate with the Euler angle of (0°, 84°, 90°) and the propagation loss αm and αf on the short-circuit surface and the open-circuit surface.

As can be clearly understood from FIG. 22, in the event that H/λ is equal to or greater than about 0.0305, the propagation loss αm is about 0.10 dB/λ or less, in the event that H/λ is equal to or greater than about 0.0335, αm is about 0.05 dB/λ or less, in the event that H/λ is equal to or greater than about 0.038, αm is about 0.02 dB/λ or less, and in the event that H/λ is about 0.0455, αm is the minimal value.

Note that in a case of using a LiNbO$_3$ substrate with the Euler angle of (0°, 84°, 90°) on which an Au electrode film has been formed with film thickness H/λ of about 0.077 or more, the surface acoustic wave propagates at phase speed Vm and Vf, less than with the "fast transverse wave" and the "slow transverse wave".

Figure 23:
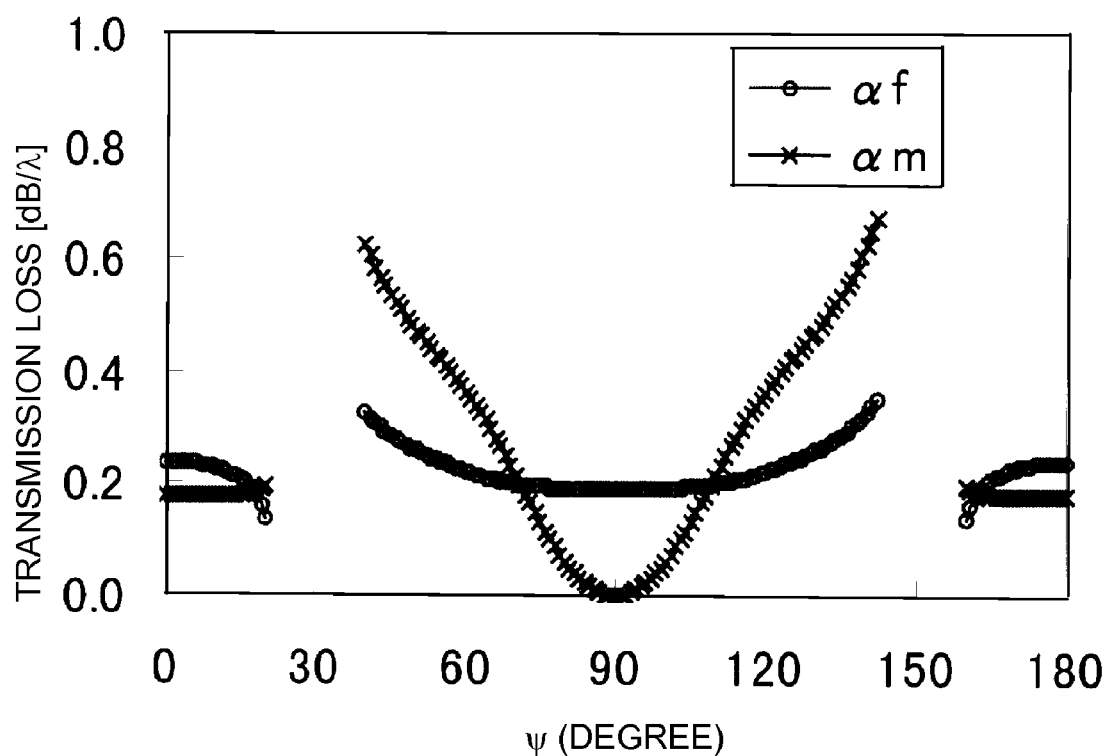
FIG. 23 shows the relation between ψ and the propagation loss αm and αf on the short-circuit surface and the open-circuit surface, with regard to a configuration wherein an Au electrode film is provided on a LiNbO$_3$ substrate with the Euler angles of (0°, 84°, ψ) and a film thickness H/λ of about 0.046.

FIG. 23 shows the relationship between the Euler angle of (0°, 84°, ψ) of the LiNbO$_3$ substrate on which the Au electrode film has been formed with the normalized film thickness H/λ of about 0.046 and the propagation loss αm and αf on the short-circuit surface and the open-circuit surface.

As can be clearly understood from FIG. 23, in the event that ψ is in the range between about 77° and about 103°, the propagation loss αm is about 0.10 dB/λ or less on the short-circuit surface, in the event that ψ is in the range between about 81° and about 99°, the propagation loss αm is about 0.05 dB/λ or less, in the event that ψ is in the range between about 84.2° and about 95.8°, the propagation loss αm is about 0.02 dB/λ or less, and in the event that ψ is about 90°, the propagation loss αm is the minimal value.

Thus, with the surface acoustic wave device according to the present preferred embodiment, the LiNbO$_3$ substrate with the Euler angle of (0°, 84°, ψ) of which ψ is in the range between about 79° and about 103° is used, whereby the propagation loss αm on the short-circuit surface can be suppressed to about 0.10 dB/λ or less.

Figure 24:
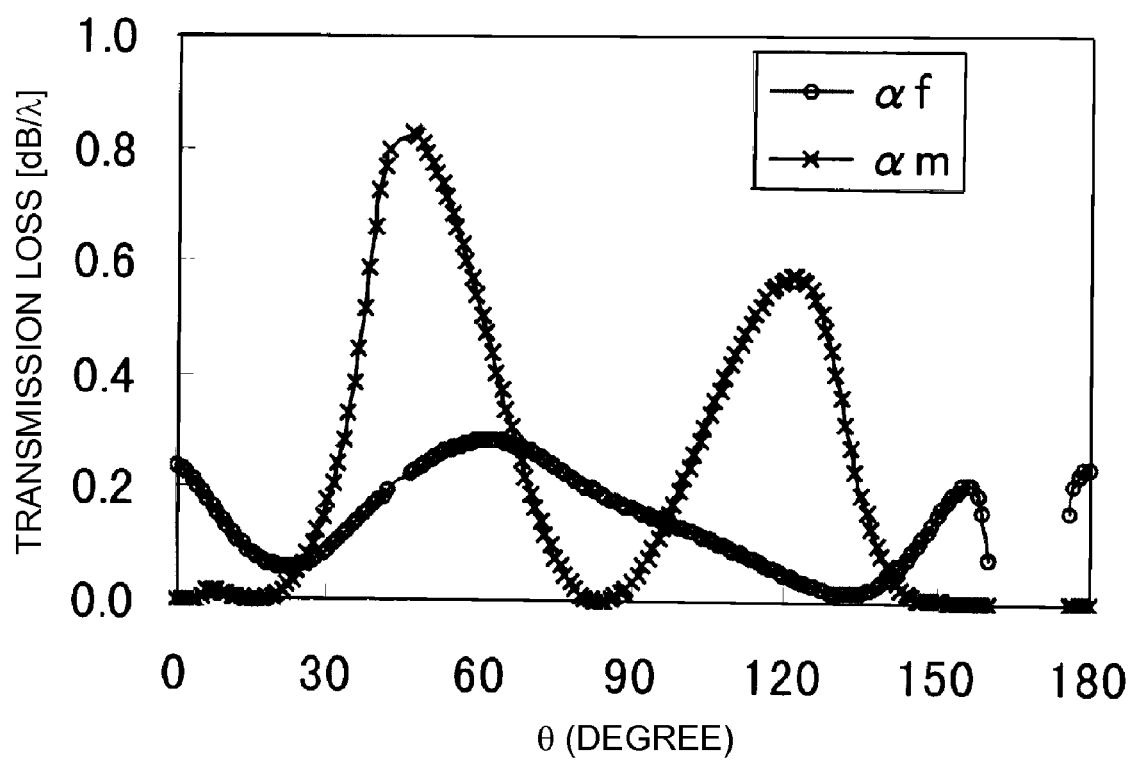
FIG. 24 shows the relationship between θ and the propagation loss αm and αf on the short-circuit surface and the open-circuit surface, with regard to a configuration wherein an Au electrode film is provided on a LiNbO$_3$ substrate with the Euler angles of (0°, θ, 90°) with the film thickness H/λ of about 0.046.

FIG. 24 shows the relationship between the Euler angle of (0°, θ, 90°) of the LiNbO$_3$ substrate on which the Au electrode film has been formed with the normalized film thickness H/λ of about 0.046 and the propagation loss αm and αf on the short-circuit surface and the open-circuit surface.

As can be clearly understood from FIG. 24, in the event that θ is in the range between about 74.8° and about 94.2°, the propagation loss αm is about 0.10 dB/λ or less, in the event that θ is in the range between about 77° and about 91°, the propagation loss αm is about 0.05 dB/λ or less, in the event that θ is in the range between about 79.4° and about 88.2°, the propagation loss αm is about 0.02 dB/λ or less, and in the event that θ is about 84°, the propagation loss αm is the minimal value.

Figure 25:
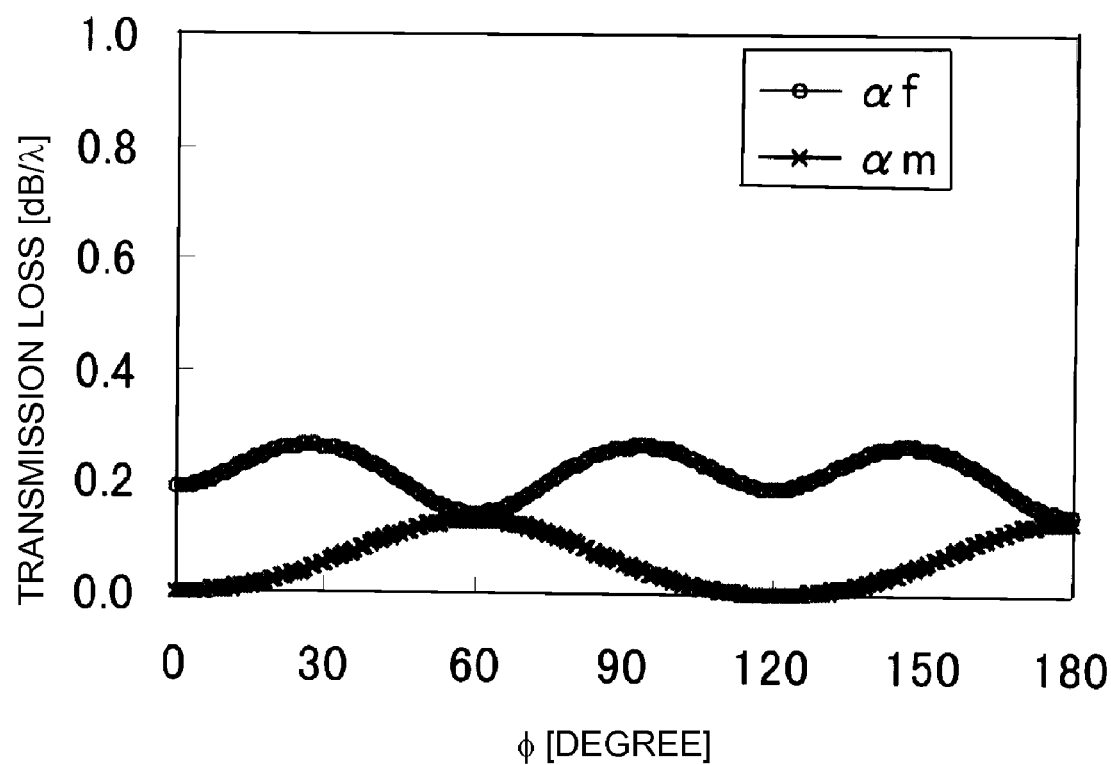
FIG. 25 shows the relationship between φ and the propagation loss αm and αf on the short-circuit surface and the open-circuit surface, with regard to a configuration wherein an Au electrode film is provided on a LiNbO$_3$ substrate with the Euler angles of (φ, 84°, 90°) and a film thickness H/λ of about 0.046.

FIG. 25 shows the relationship between the Euler angle of (φ, 84°, 90°) of the LiNbO$_3$ substrate on which the Au electrode film has been formed with the normalized film thickness H/λ of about 0.046 and the propagation loss αm and αf on the short-circuit surface and the open-circuit surface.

As can be understood from Expression (1), the relationship $$F(\phi, 84°, 90°)=F(-\phi, 84°, 90°)$$

holds, and accordingly, as can be clearly understood from FIG. 25, in the event that φ is in the range between about −42° and about 42°, the propagation loss αm is about 0.10 dB/λ or less, in the event that φ is in the range between about −28.5° and about 28.5°, the propagation loss αm is about 0.05 dB/λ or less, in the event that φ is in the range between about −18° and about 18°, the propagation loss αm is about 0.02 dB/λ or less, and in the event that φ is 0°, the propagation loss αm is the minimal value.

Note that with the above-described first through fifth preferred embodiments, the Au electrode film formed on the LiNbO$_3$ substrate not only effects reduction of the propagation loss, but also effects improvement of the electromechanical coupling coefficient $k_s^2$. For example, with the electromechanical coefficient $k_s^2$ of a surface acoustic device employing a LiNbO$_3$ substrate with the Euler angle of (30°, 90°, 45°), while when the film thickness H/λ of an Au electrode film is 0, the electromechanical coefficient $k_s^2$ is 4.6%, in the event that H/λ is in the range between about 0.05 and about 0.1, the electromechanical coupling coefficient $k_s^2$ is increased as compared to an arrangement without an Au electrode film, and an arrangement with a thin Au electrode film. Furthermore, with the surface acoustic wave device according to the present preferred embodiment, the Au electrode film is preferably formed with the film thickness H/λ in the range between about 0.05 and about 0.06 so that the electromechanical coupling coefficient $k_s^2$ can be improved to about 10% or more.

Sixth Preferred Embodiment

Figure 26:
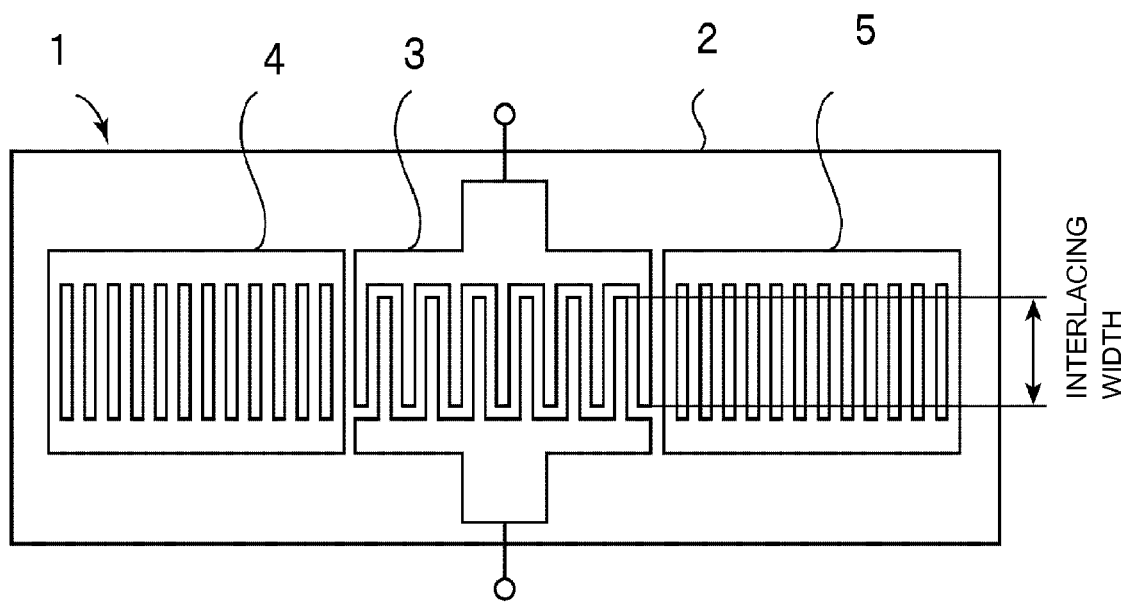
FIG. 26 is a schematic plan view which illustrates a one-port surface acoustic wave resonator according to a preferred embodiment of the present invention.

FIG. 26 is a schematic plan diagram which illustrates a surface acoustic wave resonator of a surface acoustic wave device according to a preferred embodiment of the present invention. A surface acoustic wave resonator 1 has a configuration wherein an IDT 3 and reflectors 4 and 5 are formed on a LiNbO$_3$ substrate 2 as electrode films. An Au electrode film is formed on the entire surface of the LiNbO$_3$ substrate, following which patterning is performed with the photolithography method, whereby the IDT3 and the reflectors 4 and 5 are formed. Here, the IDT3 has 50 pairs of electrode fingers, and the reflectors 4 and 5 each have 50 pairs of electrode fingers, as well. Furthermore, IDT3 is formed with an electrode-finger period about 0.998 times as long as with the reflectors. The duty ratio, i.e., the ratio of the width of the electrode finger and the space between the electrode fingers adjacent one to another in the IDT3, is about 0.6. The interlacing width of the electrode fingers of the IDT3 is about 30λ, and the period λ thereof is in the range between about 3.2 μm and about 5.2 μm.

Figure 27:
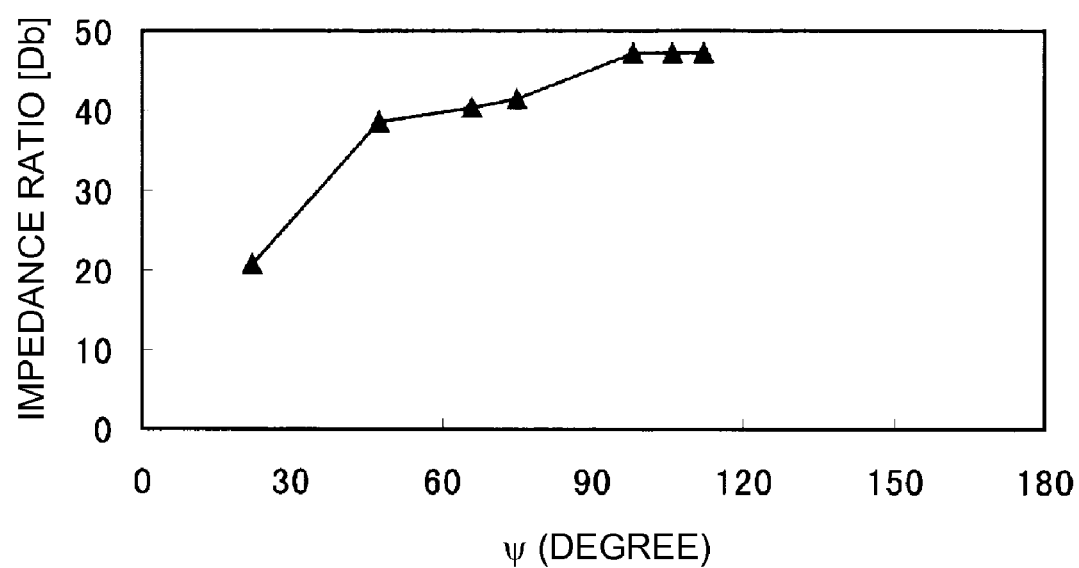
FIG. 27 shows the relationship between ψ and the impedance ratio, with regard to the surface acoustic wave resonator shown in FIG. 26, wherein an Au electrode film is provided on a LiNbO$_3$ substrate with the Euler angles of (90°, 90°, ψ) and a film thickness H/λ of about 0.019.
Figure 28:
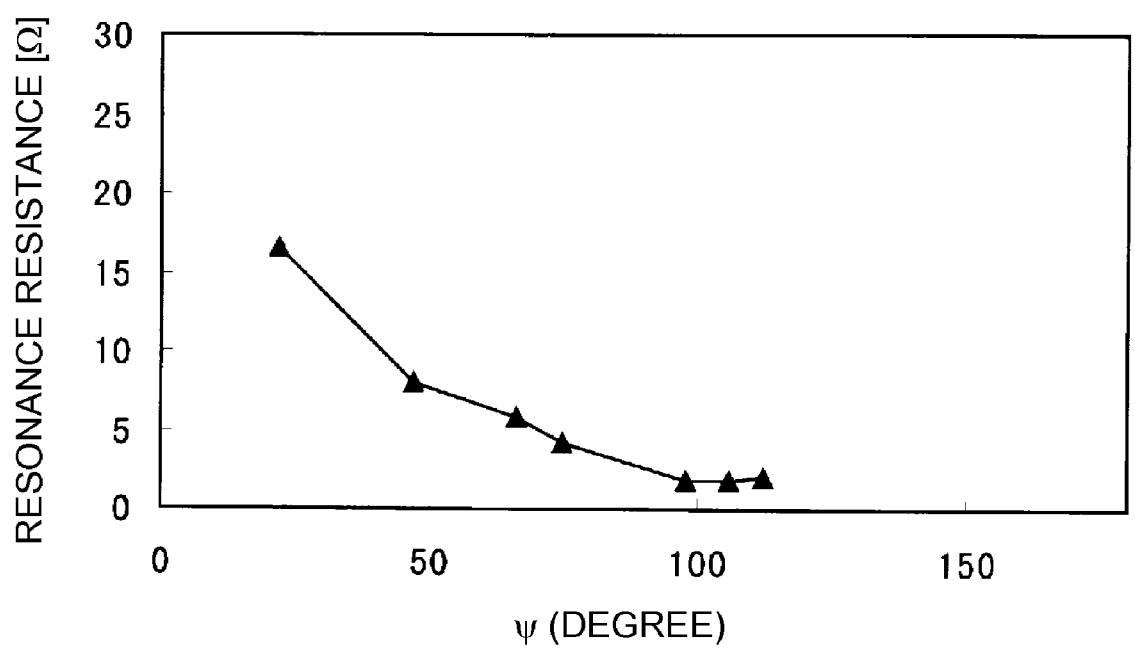
FIG. 28 shows the relationship between ψ and the resonant resistance, with regard to the surface acoustic wave resonator shown in FIG. 26, wherein an Au electrode film is provided on a LiNbO$_3$ substrate with the Euler angles of (90°, 90°, ψ) and a film thickness H/λ of about 0.019.
Figure 29:
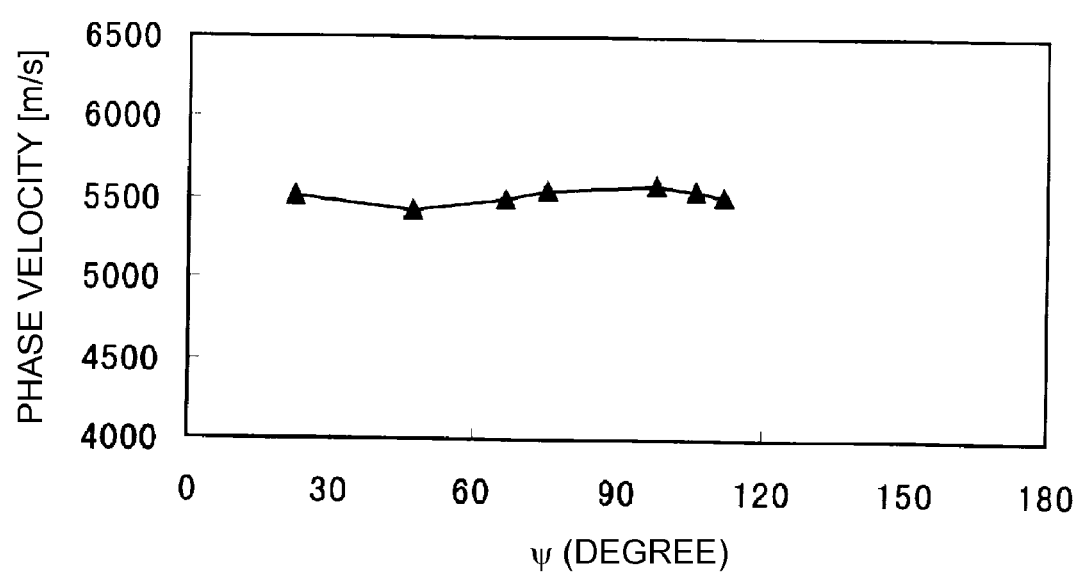
FIG. 29 shows the relationship between ψ and the phase speed, with regard to the surface acoustic wave resonator shown in FIG. 26, wherein an Au electrode film is provided on a LiNbO$_3$ substrate with the Euler angles of (90°, 90°, ψ) and a film thickness H/λ of about 0.019.

Taking the Euler angle of the LiNbO$_3$ substrate as a parameter, the relationship between ψ of the Euler angle, the impedance ratio, the resonant resistance, and the phase speed, were obtained. FIGS. 27 through 29 show the results. Note that the aforementioned impedance ratio is defined as the ratio of the impedance at the antiresonant point as to the impedance at the resonant point. Note that the results shown in FIGS. 27 through 29 were obtained with the normalized film thickness H/λ of the IDT 3 and the reflectors 4 and 5 as about 0.019.

Figure 30:
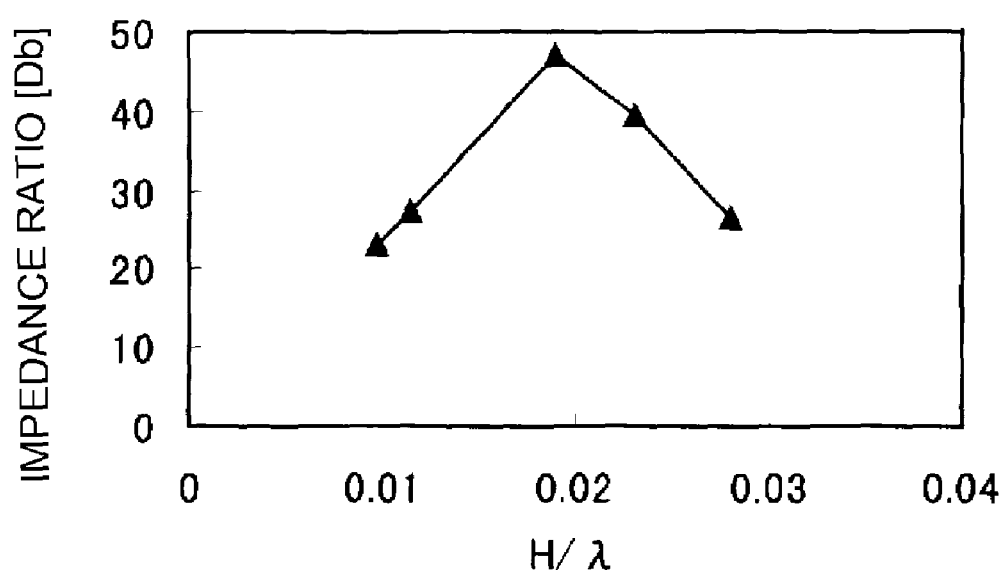
FIG. 30 shows the relationship between the Au electrode film thickness H/λ and the impedance ratio, with regard to the surface acoustic wave resonator shown in FIG. 26, wherein an Au electrode film is provided on a LiNbO$_3$ substrate with the Euler angles of (90°, 90°, 110°)
Figure 31:
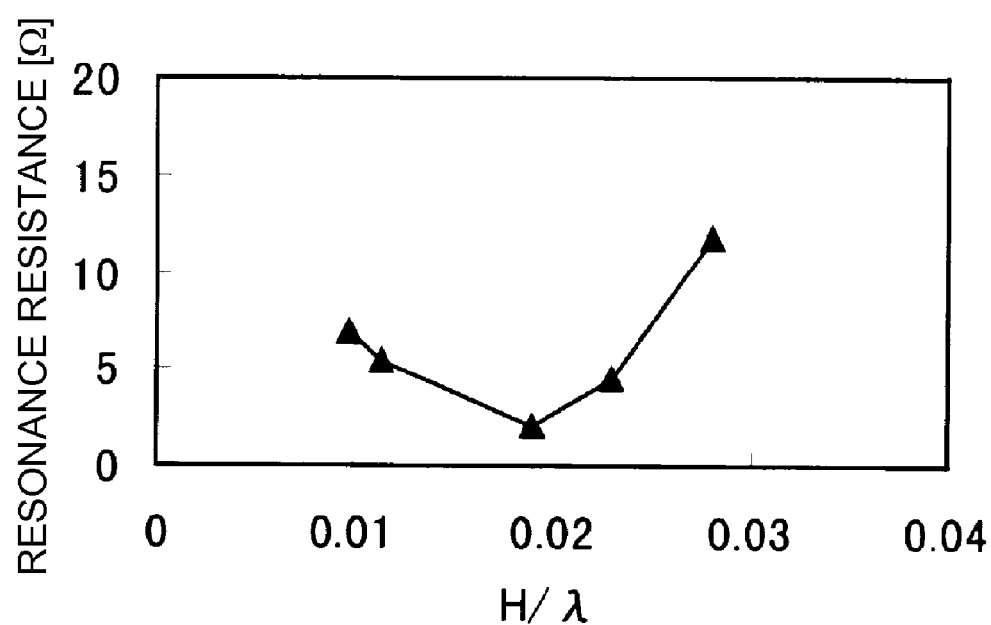
FIG. 31 shows the relationship between the Au electrode film thickness H/λ and the resonant resistance, with regard to the surface acoustic wave resonator shown in FIG. 26, wherein an Au electrode film is provided on a LiNbO$_3$ substrate with the Euler angles of (90°, 90°, 110°)
Figure 32:
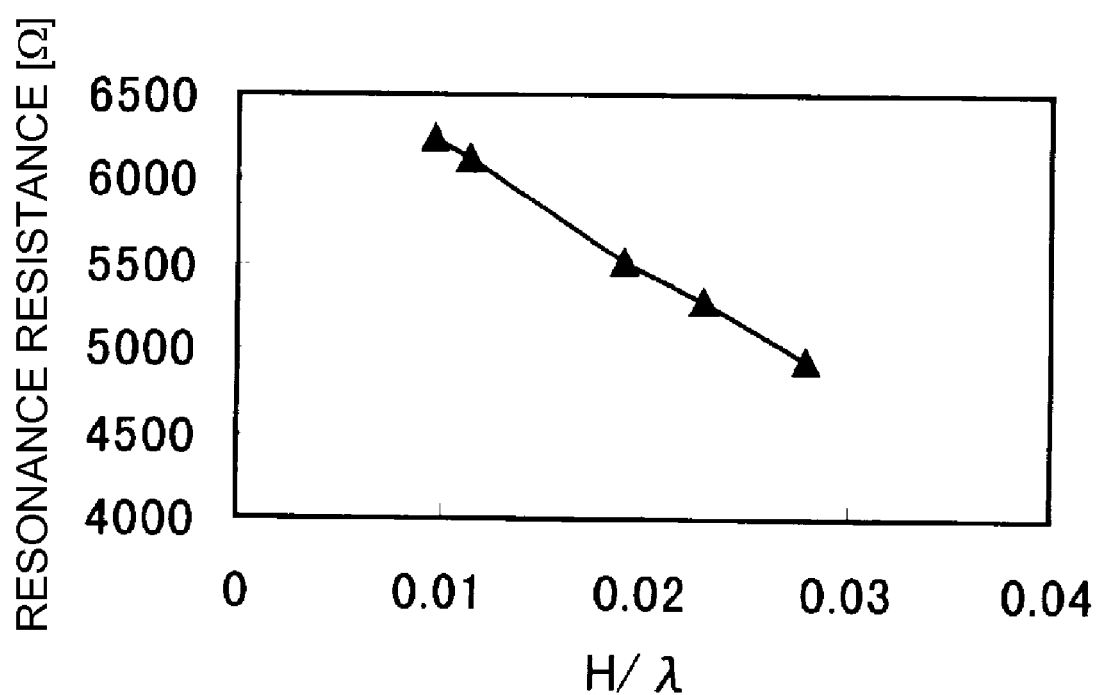
FIG. 32 shows the relationship between the Au electrode film thickness H/λ and the phase speed, with regard to the surface acoustic wave resonator shown in FIG. 26, wherein an Au electrode film is provided on a LiNbO$_3$ substrate with the Euler angles of (90°, 90°, 110°)

On the other hand, FIGS. 30 through 32 show the relationship between the normalized film thickness H/λ, the impedance ratio, the resonant resistance, and the phase speed, with the aforementioned normalized film thickness H/λ of the IDT3 and the reflectors 4 and 5 as a parameter, in a case of using a LiNbO$_3$ substrate with the Euler angle of (90°, 90°, 110°).

Figure 33:
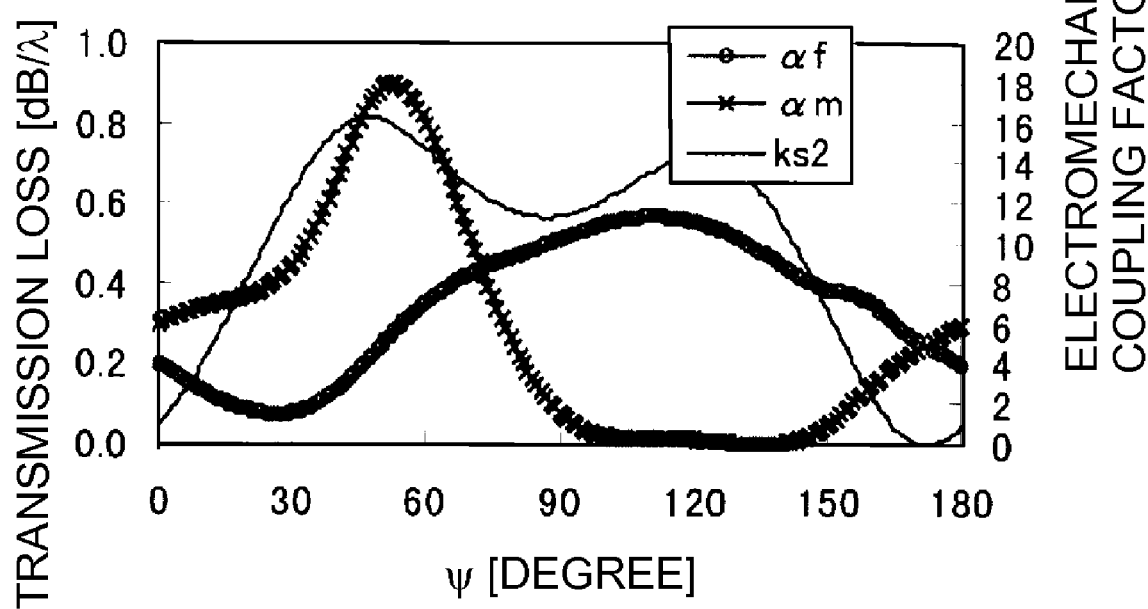
FIG. 33 shows the calculated relationship between the propagation loss αm and αf on the short-circuit surface and the open-circuit surface, the electromechanical coupling coefficient $k_s^2$, and ψ, with regard to a configuration wherein an Au electrode film is provided on a LiNbO$_3$ substrate with the Euler angles of (90°, 90°, ψ) and a film thickness H/λ of about 0.035.

As can be understood from the aforementioned Expression (1), the propagation properties of the surface acoustic wave propagating on the LiNbO$_3$ substrate of the Euler angle of (90°, θ, ψ) are the same as with the Euler angle of (30°, 180°−θ, 180°−ψ), and accordingly, the propagation loss with the Euler angle of (90°, 90°, ψ) can be obtained from the propagation properties of the surface acoustic wave propagating on the LiNbO$_3$ substrate with the Euler angle of (30°, 90°, ψ) shown in FIG. 17, with the horizontal axis being horizontally inverted. FIG. 33 shows the calculated values of the propagation loss αm and αf on the short-circuit surface and the open-circuit surface, and the electromechanical coupling coefficient $k_s^2$, with H/λ of about 0.035, thus obtained.

The surface acoustic wave resonator 1 requires an impedance ratio around about 30 dB from the point of practical use. As can be understood from FIG. 27, in the event that ψ is equal to or greater than about 31°, the impedance ratio is about 30 dB or more. Furthermore, ψ is preferably equal to or greater than about 60°, and in this case, the impedance ratio is about 40 dB or more. Moreover, in the event that ψ is about 112°, the impedance ratio is the maximal value.

Making a comparison between the calculated values shown in FIG. 33 and the calculated values shown in FIGS. 28 and 27, while a different H/λ is used, the same results can be confirmed. That is to say, with the LiNbO$_3$ substrate of the Euler angle, exhibiting the great electromechanical coupling coefficient $k_s^2$ and the small propagation loss αm on the short-circuit surface, exhibits the great impedance ratio and small resonance resistance. Thus, it has been found that the properties of the IDT correlates closely with the propagation loss αm on the short-circuit surface. Accordingly, it is thought that the peak of the impedance ratio can be obtained with ψ in the range between about 110° and about 114°, based upon the calculated results shown in FIG. 33.

Furthermore, as can be understood from FIG. 30, in the event that H/λ is in the range between about 0.0125 and about 0.0267, the impedance ratio is about 30 dB or more, in the event that H/λ is in the range between about 0.0163 and about 0.0228, the impedance ratio is about 40 dB or more, and in the event that H/λ is about 0.019, the impedance ratio is the maximal value. Note that in this case, the surface acoustic wave with the resonant frequency propagates at high phase speed of about 5512 m/s.

Seventh Preferred Embodiment

With the surface acoustic wave devices shown in the first through sixth preferred embodiments, the temperature property TCF is great. Accordingly, the aforementioned surface acoustic devices have difficulty in operating with steep filter properties at an operating temperature in the range between about −20° C. and about +80° C., for example, due to great dependence of the filter properties with regard to frequencies upon the operating temperature.

Accordingly, the present inventors studied an SiO$_2$ film formed on the substrate, which has been used for transverse-wave-component-dominant leaky surface acoustic wave described in the above-described non-patent document 4, for being applied to the second leaky surface acoustic wave in order to improve the temperature properties TCF.

Figure 34:
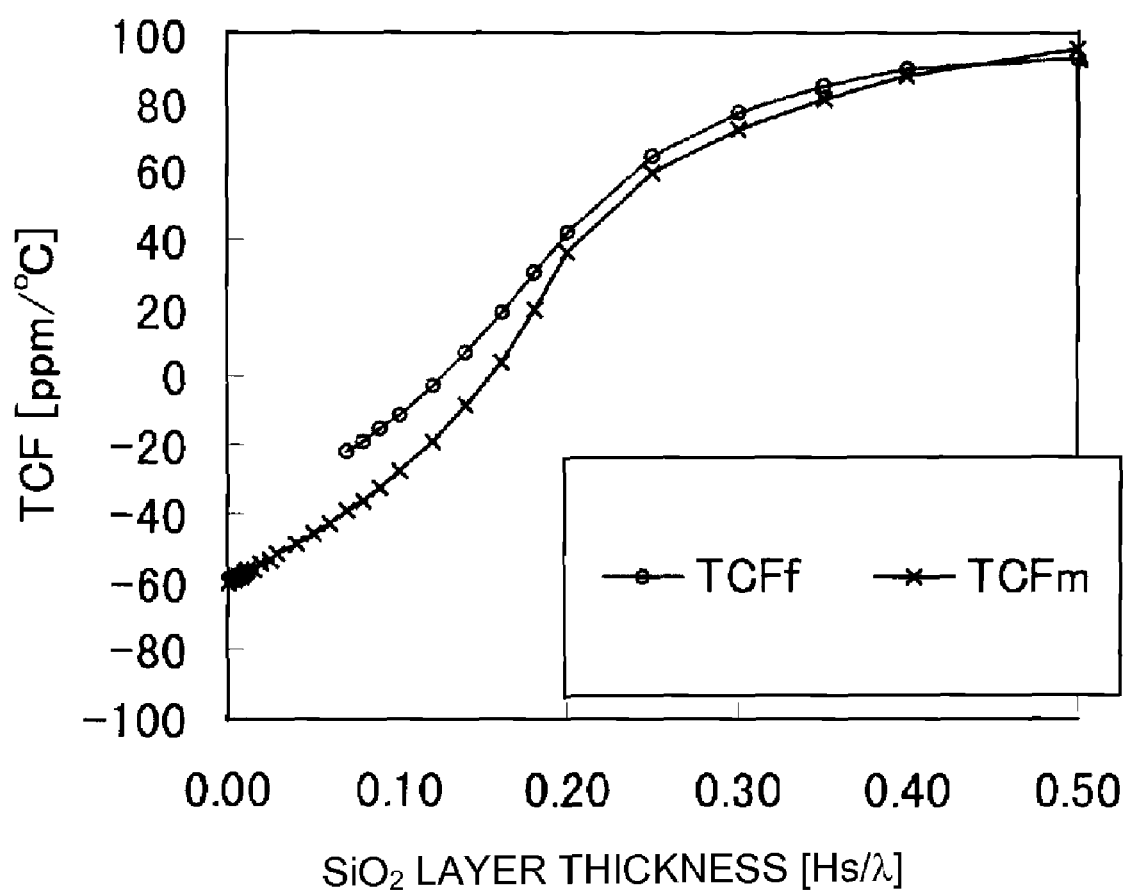
FIG. 34 shows the relationship between the SiO$_2$ film thickness H/λ and TCF on the short-circuit surface and the open-circuit surface, with regard to a configuration wherein a SiO$_2$ film is provided on a LiNbO$_3$ substrate with the Euler angles of (90°, 90°, 110°)
Figure 35:
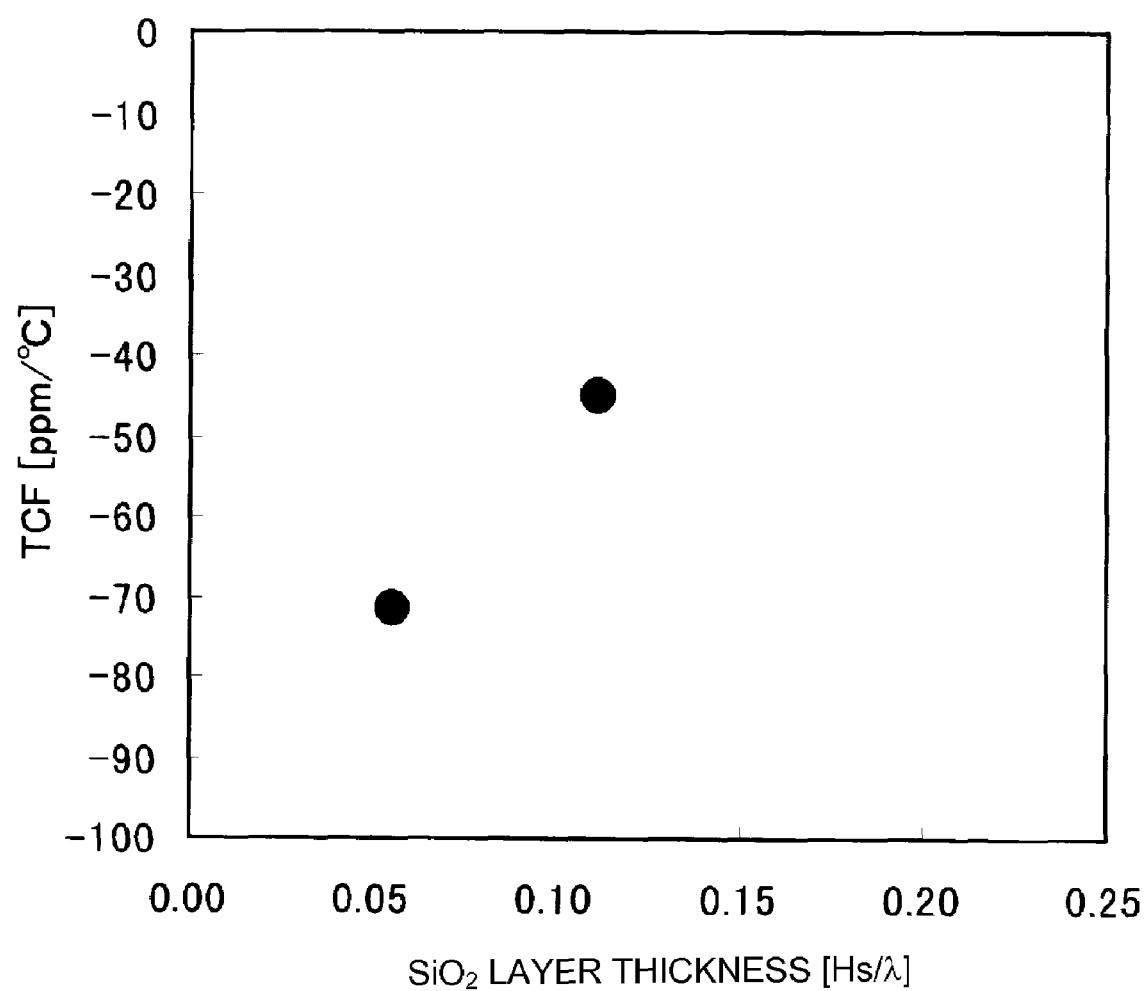
FIG. 35 shows the relationship between the SiO$_2$ film thickness H/λ and TCF, with regard to a configuration wherein a SiO$_2$ film is arranged so as to cover an IDT and reflectors, making up the surface acoustic wave resonator shown in FIG. 26, formed of Au electrode film with the film thickness H/λ of about 0.028 on a LiNbO$_3$ substrate with the Euler angles of (90°, 90°, 112°).

FIG. 34 shows the relationship between the normalized film thickness H/λ of the SiO$_2$ film and the temperature property TCF on the short-circuit surface and the open-circuit surface of the LiNbO$_3$ substrate with the Euler angle of (90°, 90°, 110°) on which the SiO$_2$ film has been formed. Furthermore, FIG. 35 shows the relationship between the normalized film thickness H/λ of the SiO$_2$ film and the temperature property TCF with regard to an arrangement wherein a one-port surface acoustic wave resonator is formed on a LiNbO$_3$ substrate with the Euler angle of (90°, 90°, 112°) in the same way as with the sixth preferred embodiment, and furthermore, a SiO$_2$ film is formed so as to cover the IDT and the reflectors by magnetron sputtering. Note that the electrode film was formed of Au with a film thickness H/λ of about 0.028.

As can be understood from FIGS. 34 and 35, the SiO$_2$ film formed on the substrate improves the temperature property TCF of an arrangement wherein the longitudinal-wave-component-dominant second leaky surface acoustic wave is used, as well. Note that it is thought that the SiO$_2$ film formed on the substrate improves not only the temperature property TCF of an arrangement wherein the electrode film is formed of Au, but also the temperature property TCF of an arrangement wherein the electrode film is formed of Al. However, the density of Al is small, i.e., about 1/7 times as great as with Au, and accordingly, in a case of using Al for the electrode film, there is the need to form the Al electrode film with a great thickness. According to the experiments performed by the present inventors, it has been discovered that the IDT formed of Al film with film thickness 7 times as great as with an arrangement wherein Au has been used for the electrode film has a rough surface, and accordingly, defects are caused in the $SiO_2$ film, leading to deterioration of the impedance ratio. On the other hand, with the arrangement wherein Au is used for the film electrode, the IDT and the reflectors are formed with a relatively small thickness, and thus, a $SiO_2$ film can be formed without defects in the $SiO_2$ film.

The surface acoustic wave devices shown in the first through fifth preferred embodiments, wherein an Au electrode film is formed on the substrate, exhibit the temperature property TCF around the range between about −60 ppm/° C. and about −80 ppm/° C. with regard to the longitudinal-wave surface acoustic wave under the condition that the surface acoustic wave propagates at high phase speed with small propagation loss. Accordingly, as can be understood from FIG. 34, in a case of forming a $SiO_2$ film on an arrangement wherein a $SiO_2$ film has not yet formed and the temperature property TCF is about −60 ppm/° C., in the event that a $SiO_2$ film is formed with the film thickness H/λ in the range between about 0.095 and about 0.192, the temperature property TCF is improved to about ±30 ppm/° C., in the event that a $SiO_2$ film is formed with the film thickness H/λ in the range between about 0.136 and about 0.168, the temperature property TCF is improved to about ±10 ppm/° C., and in the event that a $SiO_2$ film is formed with the film thickness H/λ of about 0.152, the temperature property TCF reaches zero. Furthermore, as can be understood from FIG. 35, in a case of forming a $SiO_2$ film on an arrangement wherein a $SiO_2$ film has not yet formed and the temperature property TCF is about −80 ppm/° C., in the event that a $SiO_2$ film is formed with the film thickness Hs/λ in the range between about 0.136 and about 0.299, the temperature property TCF is improved to about ±30 ppm/° C., in the event that a $SiO_2$ film is formed with the film thickness H/λ in the range between about 0.167 and about 0.193, the temperature property TCF is improved to about ±10 ppm/° C., and in the event that a $SiO_2$ film is formed with the film thickness H/λ of about 0.185, the temperature property TCF reaches zero.

Accordingly, it can be understood that there is the need to form a $SiO_2$ film with a film thickness H/λ in the range between about 0.095 and about 0.229 for suppressing the temperature property TCF in the range between about ±30 ppm/° C., and there is the need to form a $SiO_2$ film with a film thickness H/λ in the range between about 0.136 and about 0.193 for suppressing the temperature property TCF in the range between about ±10 ppm/° C.

Note that the present invention is not restricted to the above-described preferred embodiments. Furthermore, with the configuration of the surface acoustic wave device, the present invention not only can be applied to the aforementioned one-port surface acoustic wave resonator, but also can be applied to a ladder filter having a configuration wherein multiple surface acoustic wave resonators are connected in serial and in parallel, various types of resonator filters, and a transversal surface acoustic wave filter.

Furthermore, the electrode film used in the present invention is not restricted to an electrode film formed of pure Au, rather, an arrangement may be made wherein the electrode film is formed of an alloy of Au as a principal component.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device comprising:
a $LiNbO_3$ substrate; and
an electrode film made of one of Au and an alloy of Au as a principal component thereof and disposed on said $LiNbO_3$ substrate; wherein
surface acoustic waves including a longitudinal wave component as a main component propagate along the $LiNbO_3$ substrate, and an Euler angle of said substrate is a Euler angle located within areas A01 through A17 defined by a rectangle with four corners having coordinates (1), (2), (3), and (4) shown in the following table, or an Euler angle equivalent thereof:

| AREA | COORDINATES (1) | COORDINATES (2) |
|---|---|---|
| AREA A01 | (0°, 7°, 101°) | (0°, 23°, 101°) |
| AREA A02 | (0°, 75°, 101°) | (0°, 92°, 101°) |
| AREA A03 | (0°, 146°, 155°) | (0°, 168°, 155°) |
| AREA A04 | (0°, 146°, 60°) | (0°, 168°, 60°) |
| AREA A05 | (10°, 6°, 94°) | (10°, 12°, 94°) |
| AREA A06 | (10°, 77°, 96°) | (10°, 93°, 96°) |
| AREA A07 | (10°, 139°, 162°) | (10°, 164°, 162°) |
| AREA A08 | (10°, 150°, 62°) | (10°, 171°, 62°) |
| AREA A09 | (20°, 7°, 84°) | (20°, 24°, 84°) |
| AREA A11 | (20°, 127°, 167°) | (20°, 163°, 167°) |
| AREA A12 | (20°, 153°, 67°) | (20°, 172°, 67°) |
| AREA A13 | (30°, 10°, 76°) | (30°, 25°, 76°) |
| AREA A14 | (30°, 41°, 156°) | (30°, 58°, 156°) |
| AREA A16 | (30°, 139°, 156°) | (30°, 122°, 156°) |
| AREA A17 | (30°, 170°, 76°) | (30°, 155°, 76°) |

| AREA | COORDINATES (3) | COORDINATES (4) |
|---|---|---|
| AREA A01 | (0°, 23°, 79°) | (0°, 7°, 79°) |
| AREA A02 | (0°, 92°, 79°) | (0°, 75°, 79°) |
| AREA A03 | (0°, 168°, 120°) | (0°, 146°, 120°) |
| AREA A04 | (0°, 168°, 25°) | (0°, 146°, 25°) |
| AREA A05 | (10°, 23°, 67°) | (10°, 6°, 67°) |
| AREA A06 | (10°, 93°, 72°) | (10°, 77°, 72°) |
| AREA A07 | (10°, 164°, 107°) | (10°, 139°, 107°) |
| AREA A08 | (10°, 171°, 33°) | (10°, 150°, 33°) |
| AREA A09 | (20°, 24°, 61°) | (20°, 7°, 61°) |
| AREA A11 | (20°, 163°, 118°) | (20°, 127°, 118°) |
| AREA A12 | (20°, 172°, 40°) | (20°, 153°, 40°) |
| AREA A13 | (30°, 25°, 51°) | (30°, 10°, 51°) |
| AREA A14 | (30°, 58°, 133°) | (30°, 41°, 133°) |
| AREA A16 | (30°, 122°, 133°) | (30°, 139°, 133°) |
| AREA A17 | (30°, 155°, 51°) | (30°, 170°, 51°). |

2. A surface acoustic wave device according to claim 1, wherein one of a bus bar, an IDT, a reflector, and a surface acoustic waveguide is defined by said electrode film.

3. A surface acoustic wave device according to claim 1, further comprising a $SiO_2$ film arranged so as to cover said electrode film.

4. A surface acoustic wave device comprising:
a $LiNbO_3$ substrate; and
an electrode film made of one of Au and an alloy of Au as a principal component thereof and disposed on said $LiNbO_3$ substrate; wherein
surface acoustic waves including a longitudinal wave component as a main component propagate along the substrate, an Euler angle of said $LiNbO_3$ substrate is (φ, θ, ψ) where φ is between about 21.5° and about 38.5°, θ is between about 80° and about 100°, and is between about 24.5° and about 91.8°, or a Euler angle equivalent thereof, and a ratio H/λ is between about 0.005 and about 0.08 where H is the thickness of said electrode film and λ is the wavelength of the surface acoustic wave.

5. A surface acoustic wave device according to claim 4, wherein one of a bus bar, an IDT, a reflector, and a surface acoustic waveguide is defined by said electrode film.

6. A surface acoustic wave device according to claim 4, further comprising a $SiO_2$ film arranged so as to cover said electrode film.

7. A surface acoustic wave device comprising:
a $LiNbO_3$ substrate; and
an electrode film made of one of Au and an alloy of Au as a principal component thereof and disposed on said $LiNbO_3$ substrate; wherein
surface acoustic waves including a longitudinal wave component as a main component propagate along the substrate, an Euler angle of said $LiNbO_3$ substrate is (φ, θ, ψ) where φ is between about 21.5° and about 38.5°, θ is between about 80° and about 100°, and ψ is between about 1° and about 96.5°, or a Euler angle equivalent thereof, and a ratio H/λ is between about 0.005 and about 0.08 where H is the thickness of said electrode film and λ is the wavelength of the surface acoustic wave.

8. A surface acoustic wave device according to claim 7, wherein one of a bus bar, an IDT, a reflector, and a surface acoustic waveguide is defined by said electrode film.

9. A surface acoustic wave device according to claim 7, further comprising a $SiO_2$ film arranged so as to cover said electrode film.

10. A surface acoustic wave device comprising:
a $LiNbO_3$ substrate; and
an electrode film made of one of Au and an alloy of Au as a principal component thereof and disposed on said $LiNbO_3$ substrate; wherein
surface acoustic waves including a longitudinal wave component as a main component propagate along the substrate, and an Euler angle of said $LiNbO_3$ substrate is (φ, θ, ψ) where φ is between about 85° and about 95°, θ is between about 85° and about 95°, and ψ between about 30° and about 130°, or a Euler angle equivalent thereof.

11. A surface acoustic wave device according to claim 10, wherein one of a bus bar, an IDT, a reflector, and a surface acoustic waveguide is defined by said electrode film.

12. A surface acoustic wave device according to claim 10, further comprising a $SiO_2$ film arranged so as to cover said electrode film.

* * * * *